United States Patent
Park et al.

(10) Patent No.: US 11,649,545 B2
(45) Date of Patent: May 16, 2023

(54) TRANSITION METAL-DICHALCOGENIDE THIN FILM AND MANUFACTURING METHOD THEREFOR

(71) Applicant: INDUSTRY-UNIVERSITY COOPERATION FOUNDATION HANYANG UNIVERSITY ERICA CAMPUS, Ansan-Si (KR)

(72) Inventors: Tae Joo Park, Ansan-si (KR); Dae Hyun Kim, Ansan-si (KR); Daewoong Kim, Ansan-si (KR); Tae Jun Seok, Yongin-si (KR); Hyunsoo Jin, Ansan-si (KR)

(73) Assignee: INDUSTRY-UNIVERSITY COOPERATION FOUNDATION HANYANG UNIVERSITY ERICA CAMPUS, Ansan-Si (KR)

( * ) Notice: Subject to any disclaimer, the term of this patent is extended or adjusted under 35 U.S.C. 154(b) by 328 days.

(21) Appl. No.: 16/874,802

(22) Filed: May 15, 2020

(65) Prior Publication Data

US 2020/0277700 A1    Sep. 3, 2020

Related U.S. Application Data

(63) Continuation of application No. PCT/KR2018/015585, filed on Dec. 10, 2018.

(30) Foreign Application Priority Data

Dec. 13, 2017 (KR) .................. 10-2017-0170951
Nov. 26, 2018 (KR) .................. 10-2018-0147152

(51) Int. Cl.
    *C23C 16/30* (2006.01)
    *H01L 21/02* (2006.01)

(52) U.S. Cl.
    CPC ........ *C23C 16/305* (2013.01); *H01L 21/0262* (2013.01); *H01L 21/02568* (2013.01)

(58) Field of Classification Search
    CPC ............. C23C 16/305; H01L 21/02568; H01L 21/0262; H01L 21/0242; H01L 21/02614;
    (Continued)

(56) References Cited

U.S. PATENT DOCUMENTS

| 8,507,040 B2 | 8/2013 | Xiao et al. |
| 8,765,223 B2 | 7/2014 | Xiao et al. |

(Continued)

FOREIGN PATENT DOCUMENTS

| KR | 10-2012-0137296 | 12/2012 |
| KR | 10-2014-0115723 | 10/2014 |

(Continued)

OTHER PUBLICATIONS

International Search Report for International Application No. PCT/KR2018/015585 dated Mar. 18, 2019, 5 pages.

(Continued)

*Primary Examiner* — Julia Slutsker
(74) *Attorney, Agent, or Firm* — Finch & Maloney PLLC

(57) ABSTRACT

A method for manufacturing a transition metal-dichalcogenide thin film is provided. The method for manufacturing a transition metal-dichalcogenide thin film can comprise the steps of: preparing a base substrate within a chamber; preparing a precursor comprising a transition metal; repeatedly carrying out, multiple times, a step of providing the precursor on the base substrate and a step of purging the chamber, thereby forming, on the base substrate, a preliminary thin film in which the precursor is adsorbed; and manufacturing a transition metal-dichalcogenide thin film by heat treating the preliminary thin film in a gas atmosphere comprising a chalcogen element.

12 Claims, 28 Drawing Sheets

(58) Field of Classification Search
CPC ......... H01L 21/28568; H01L 21/02205; H01L 21/02592; H01L 21/324
See application file for complete search history.

(56) References Cited

U.S. PATENT DOCUMENTS

| | | |
|---|---|---|
| 9,719,186 B2 | 8/2017 | Kim et al. |
| 9,773,668 B2 | 9/2017 | Lee et al. |
| 2016/0122867 A1* | 5/2016 | Han ........................ C23C 16/18 556/59 |
| 2016/0122868 A1* | 5/2016 | Kim ........................ C23C 16/52 427/255.35 |
| 2016/0308006 A1* | 10/2016 | Park ........................ H01L 29/24 |
| 2017/0073809 A1 | 3/2017 | Choi et al. |
| 2018/0105930 A1 | 4/2018 | Kang et al. |
| 2021/0269915 A1* | 9/2021 | McKee ............. H01L 21/02568 |

FOREIGN PATENT DOCUMENTS

| | | |
|---|---|---|
| KR | 10-2015-0098904 | 8/2015 |
| KR | 10-1638121 | 7/2016 |
| KR | 10-1682307 | 11/2016 |
| KR | 10-2017-0014319 | 2/2017 |
| KR | 10-2017-0048873 | 5/2017 |

OTHER PUBLICATIONS

Written Opinion for International Application No. PCT/KR2018/015585 dated Mar. 18, 2019, 12 pages.

* cited by examiner

[FIG. 1]
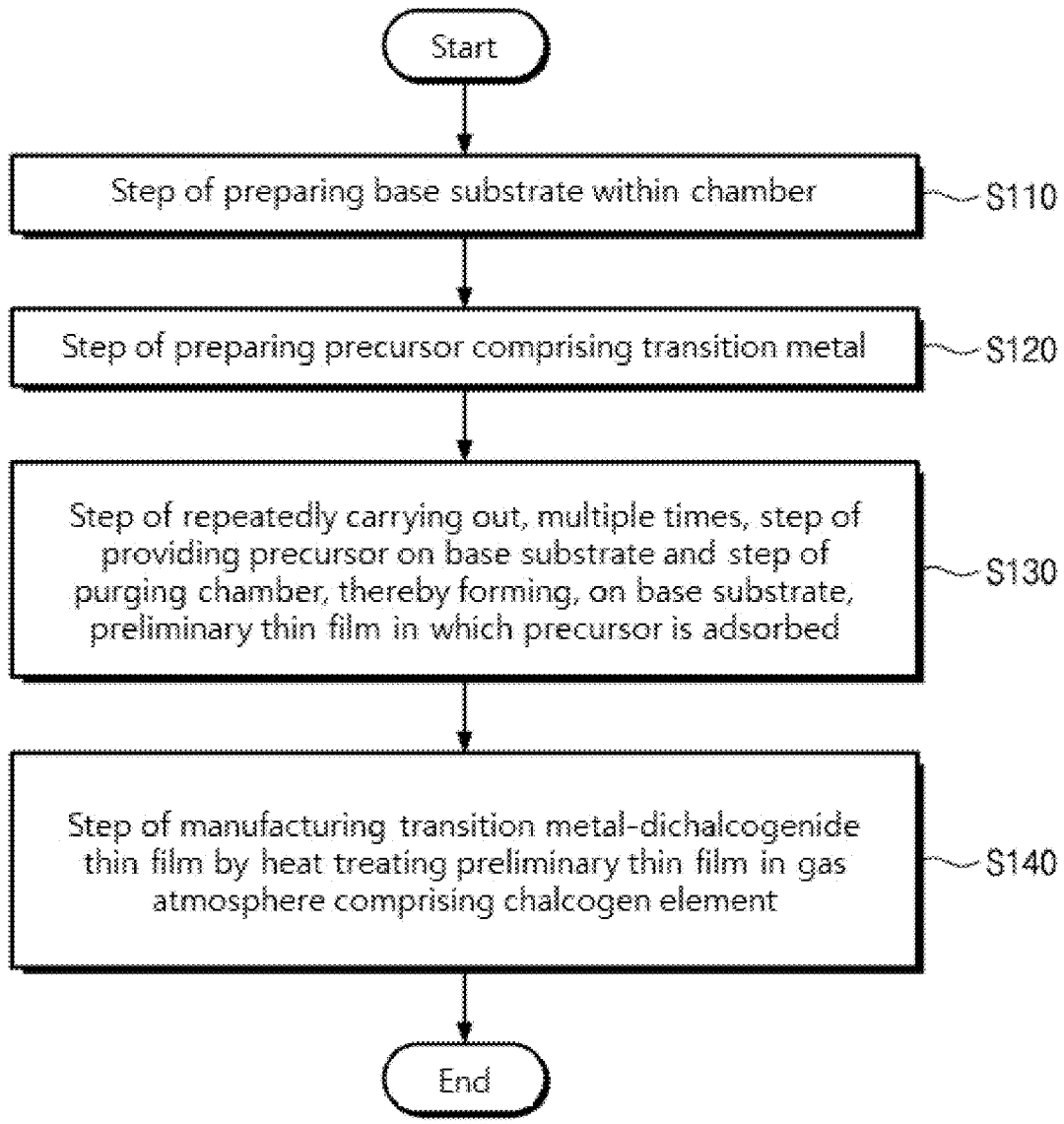

[FIG. 2]
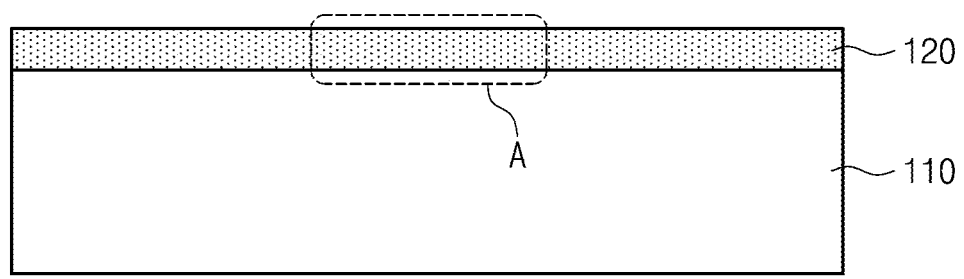

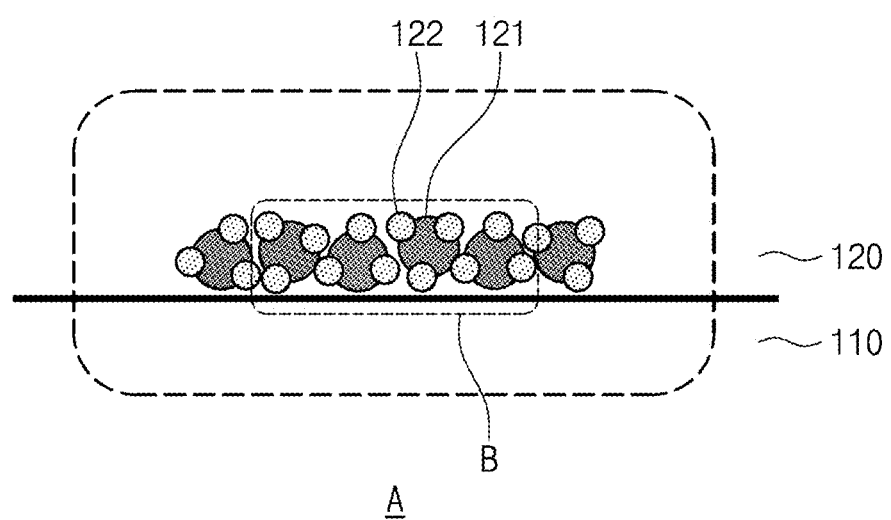

[FIG. 4]
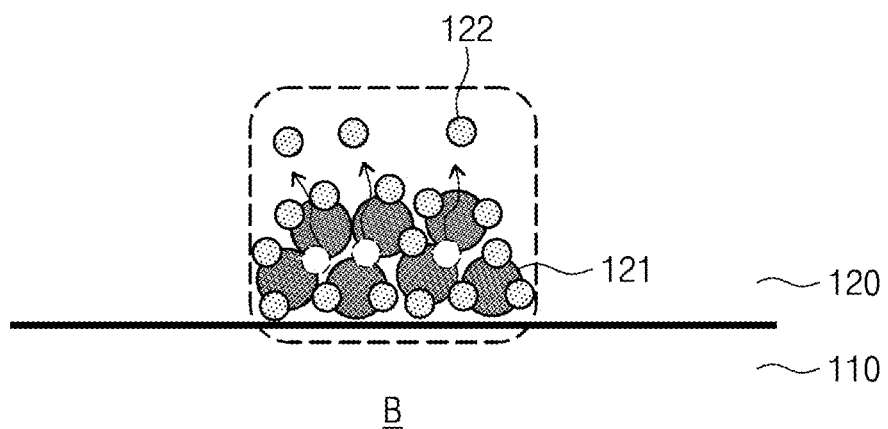
B

[FIG. 5]
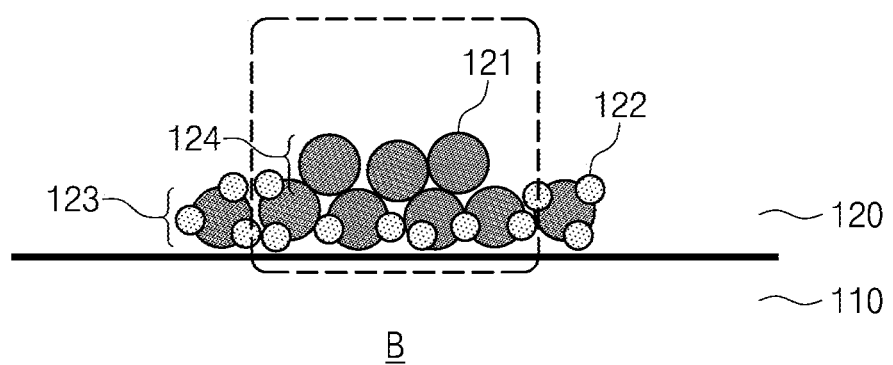

[FIG. 6]
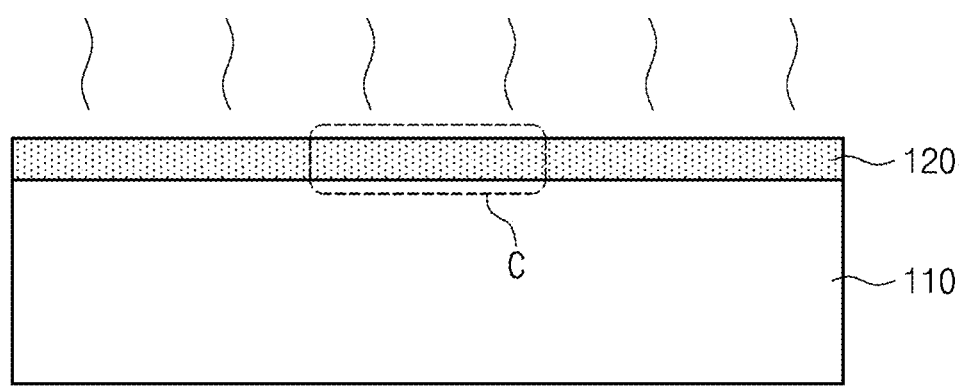

[FIG. 7]
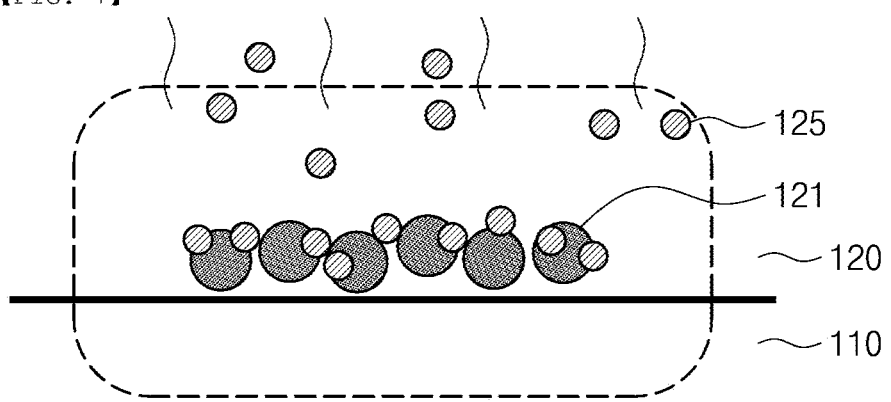
C

[FIG. 8]
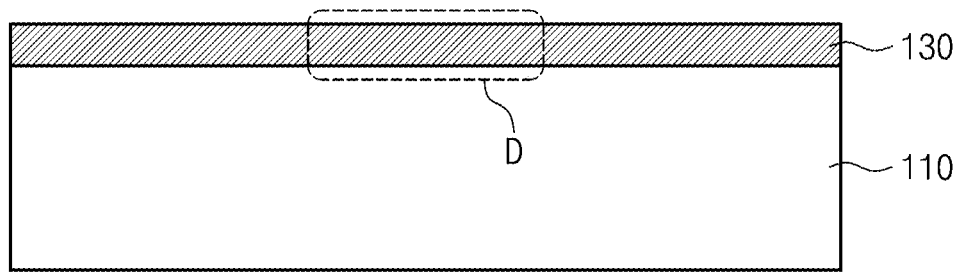

[FIG. 9]
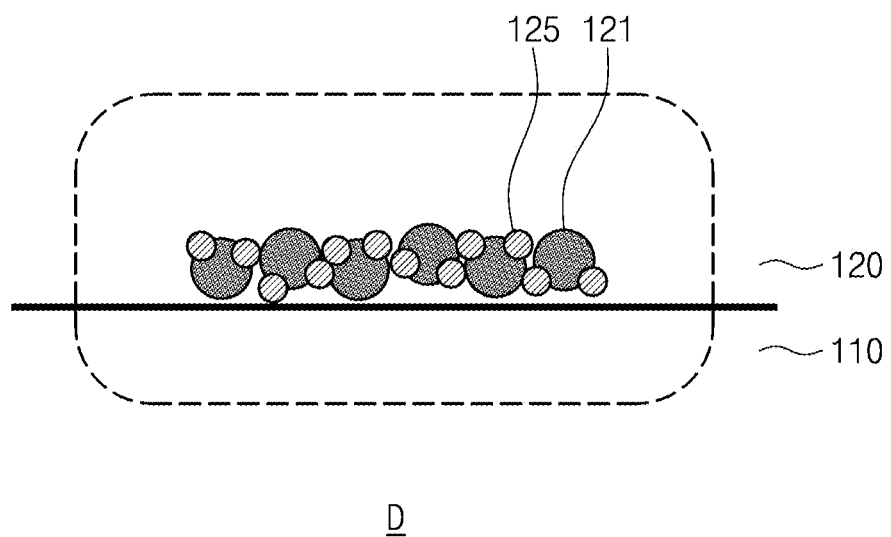
D

[FIG. 10]
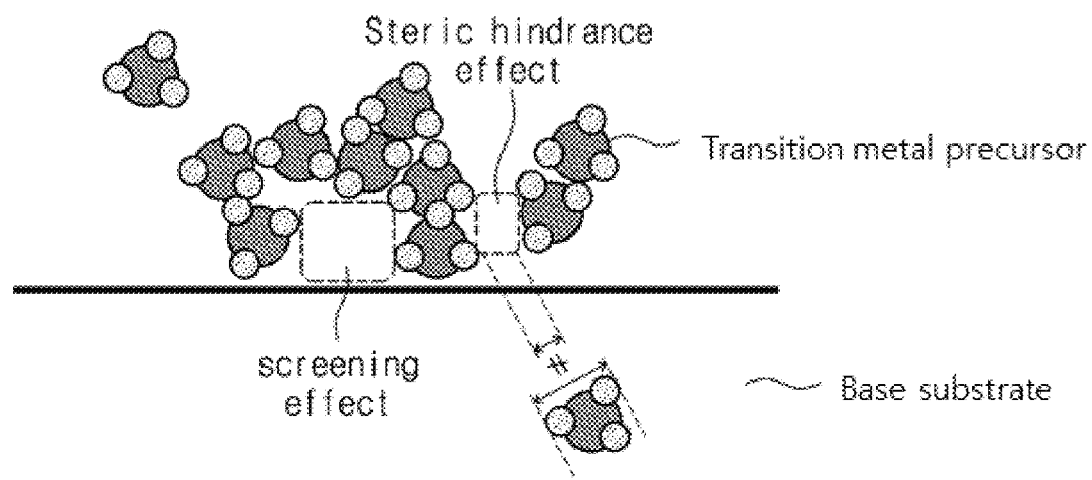

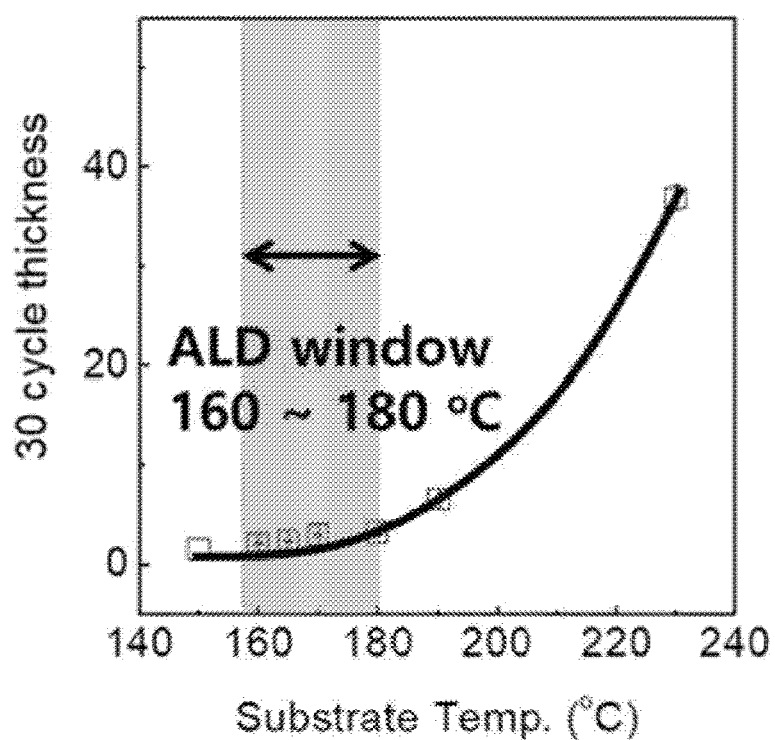
[FIG. 11]

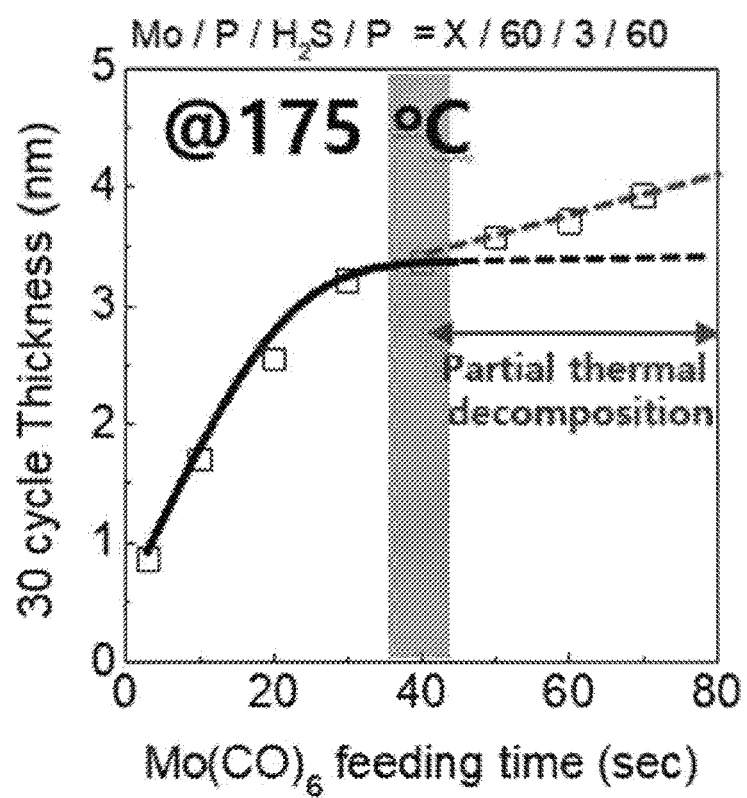
[FIG. 12]

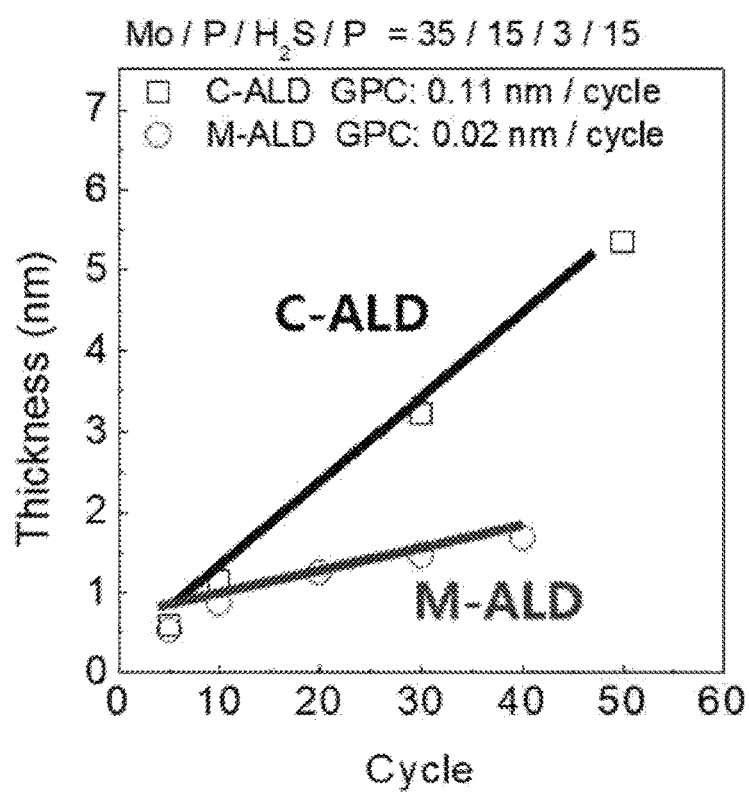
[FIG. 13]

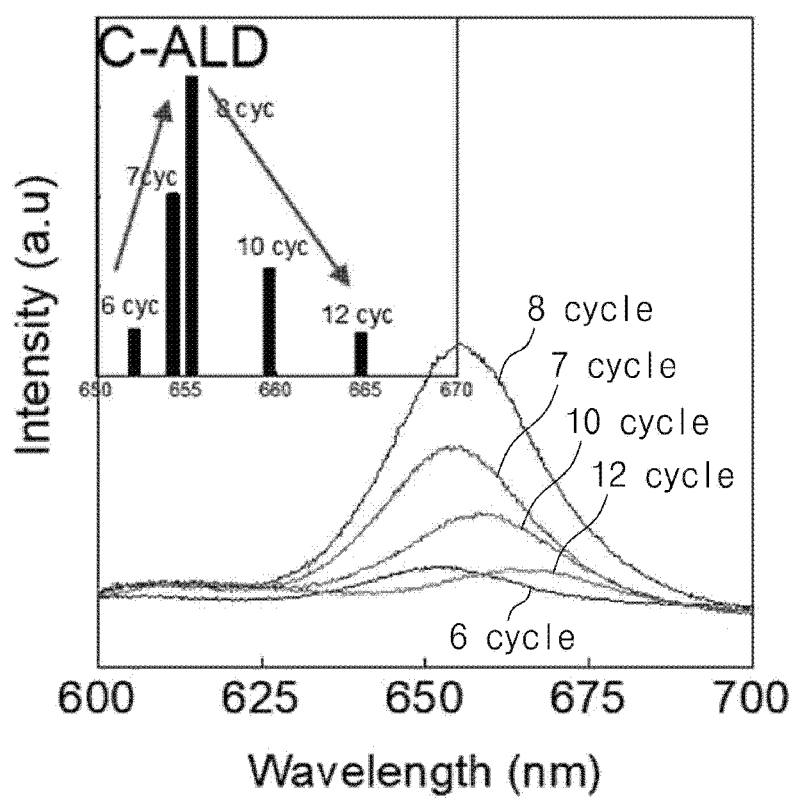
[FIG. 14]

[FIG. 15]
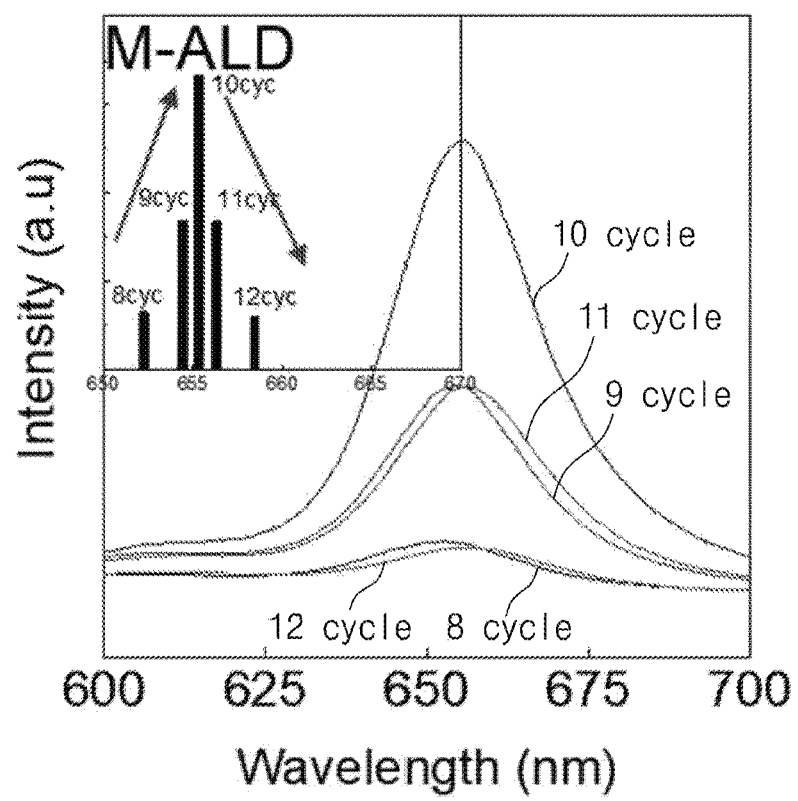

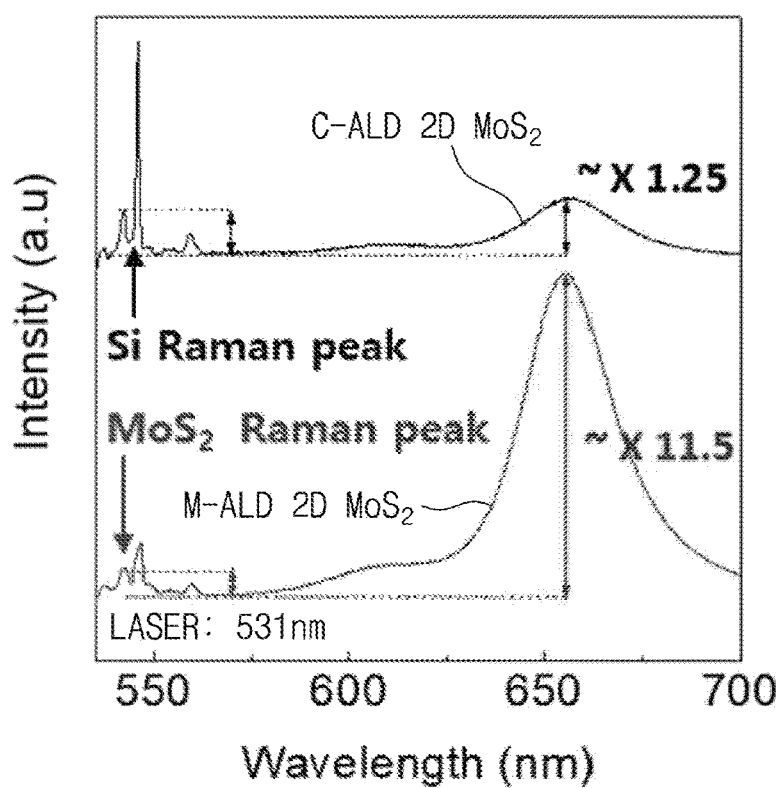
[FIG. 16]

[FIG. 17]
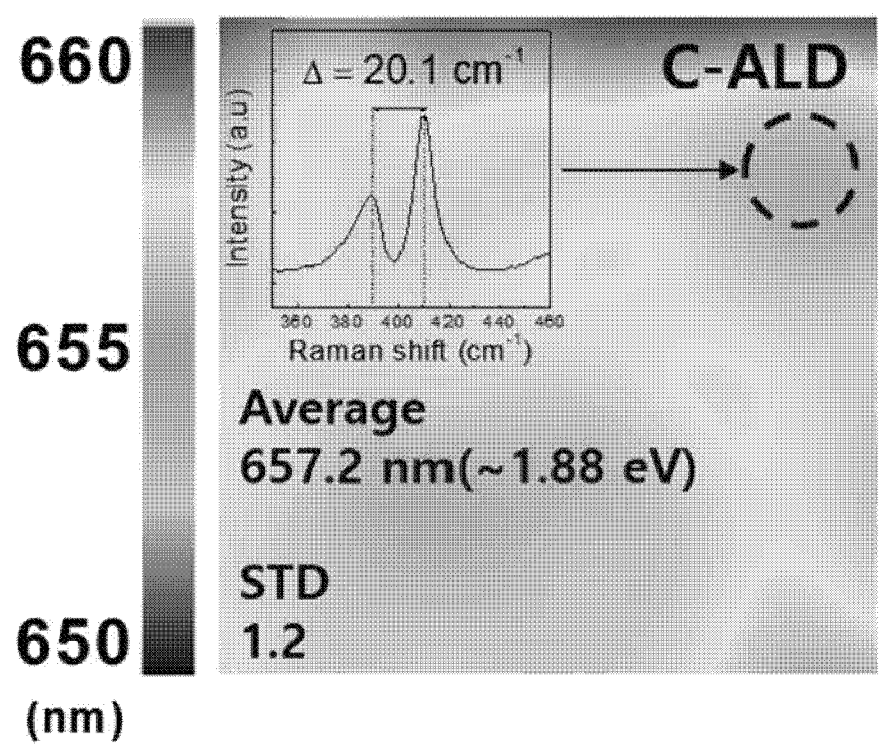

[FIG. 18]
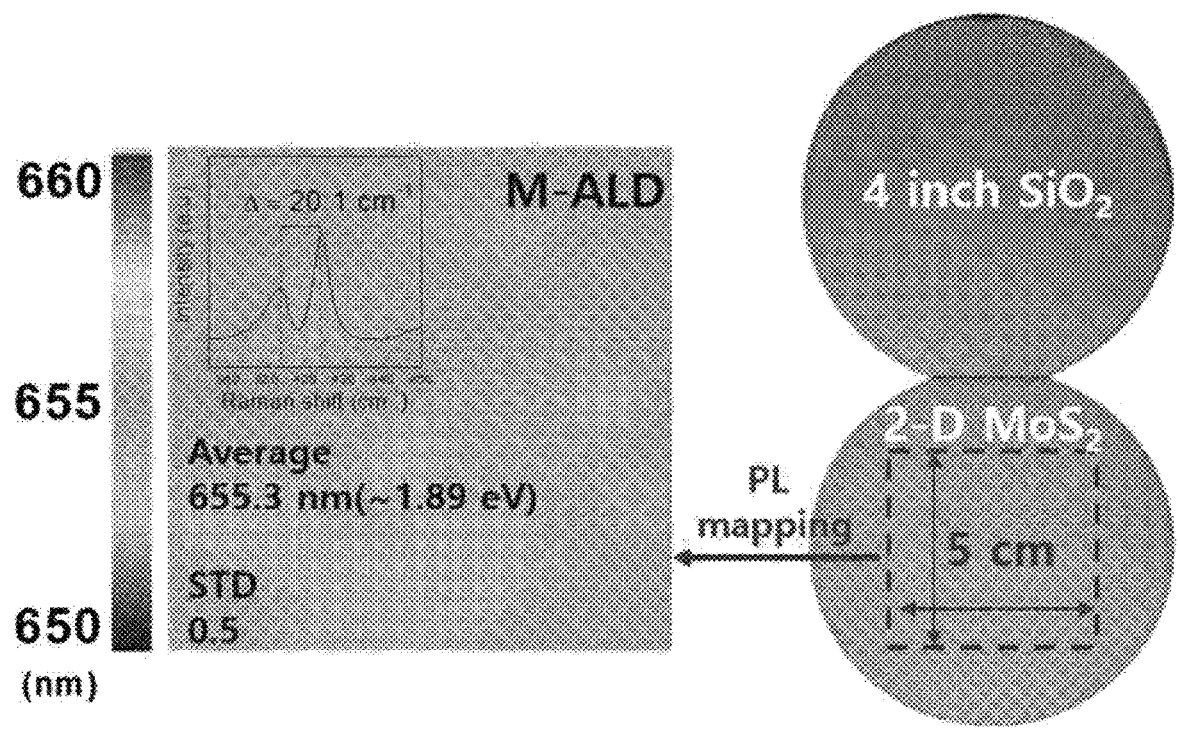

[FIG. 19]
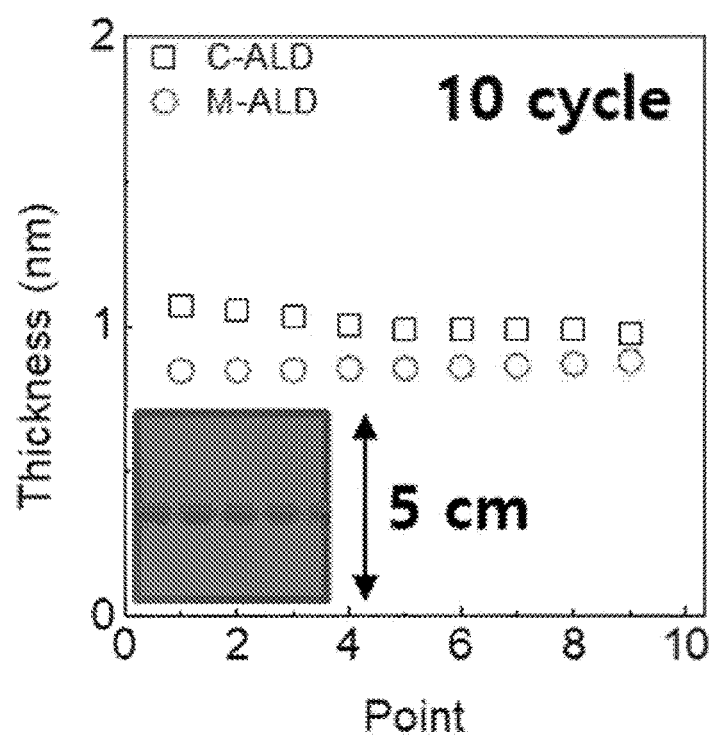

[FIG. 20]
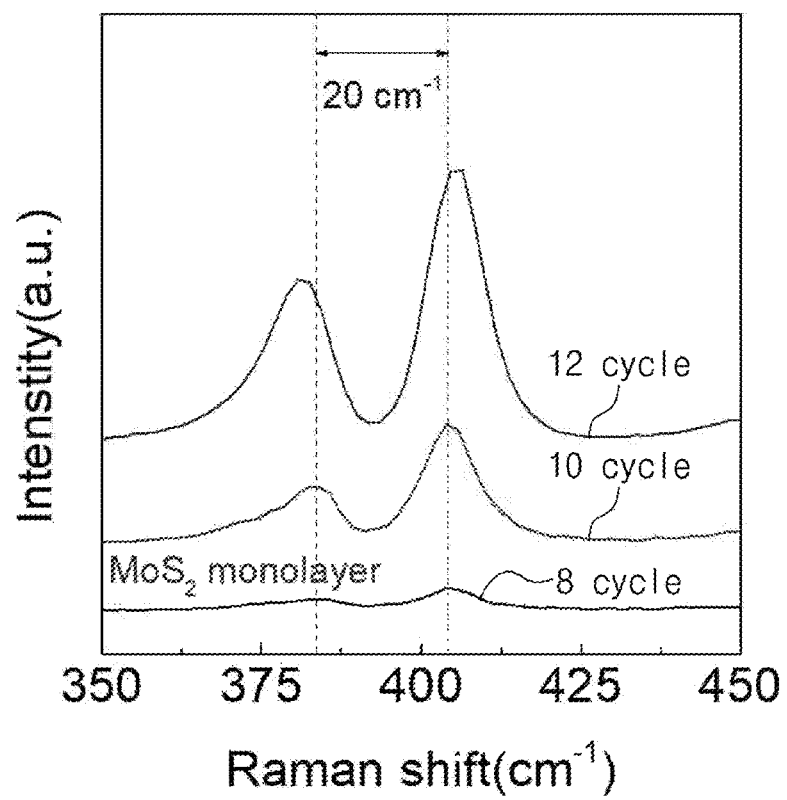

[FIG. 21]
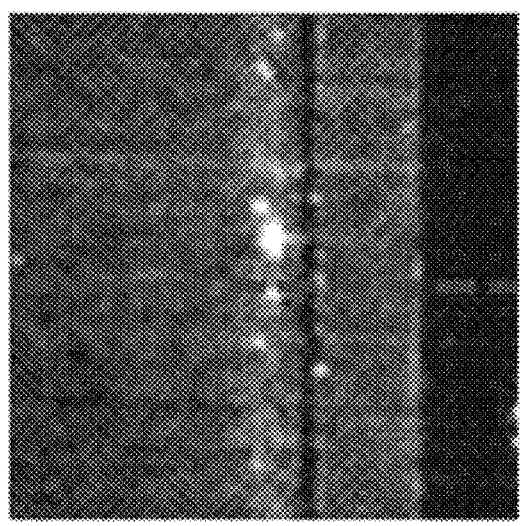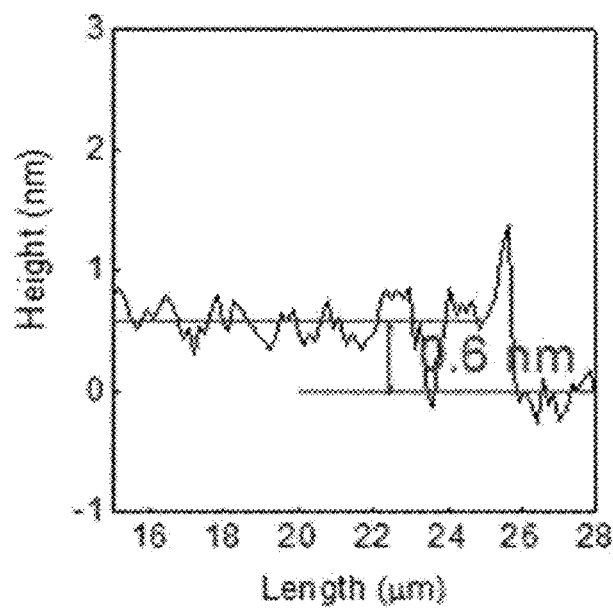

[FIG. 22]
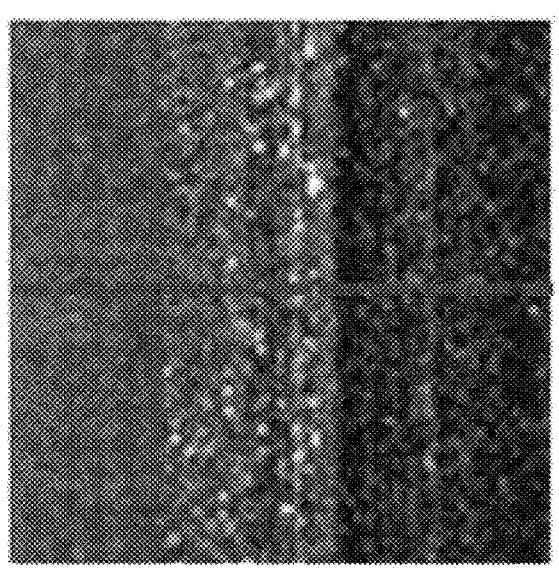
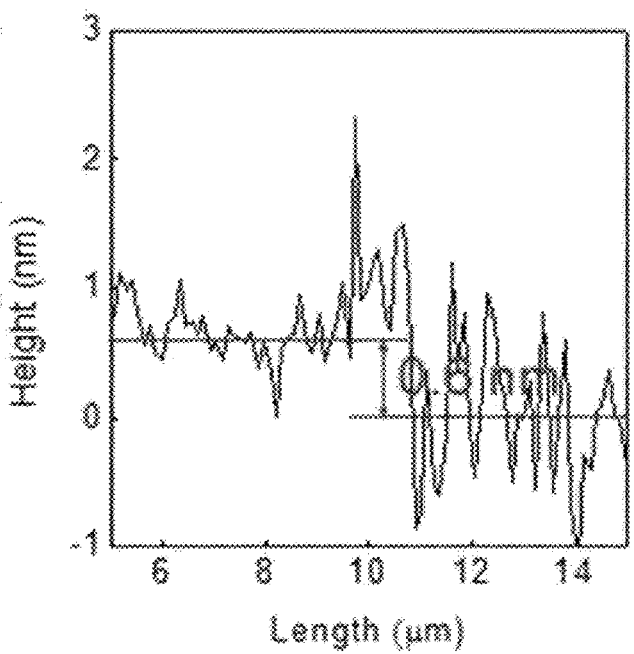

[FIG. 23]
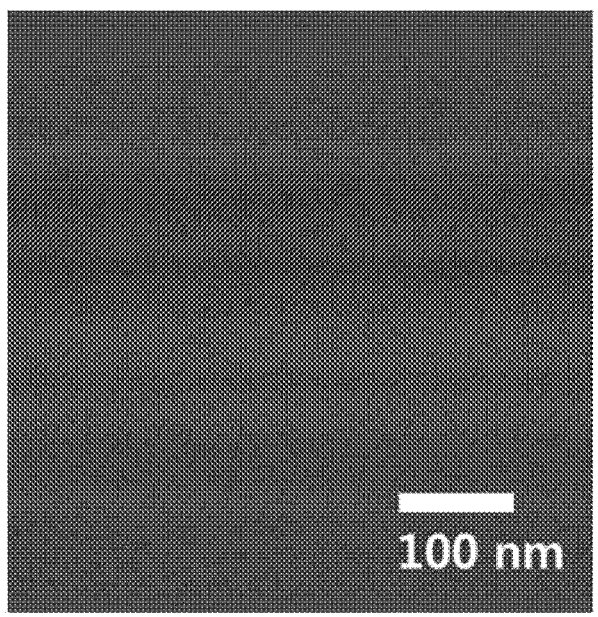

[FIG. 24]
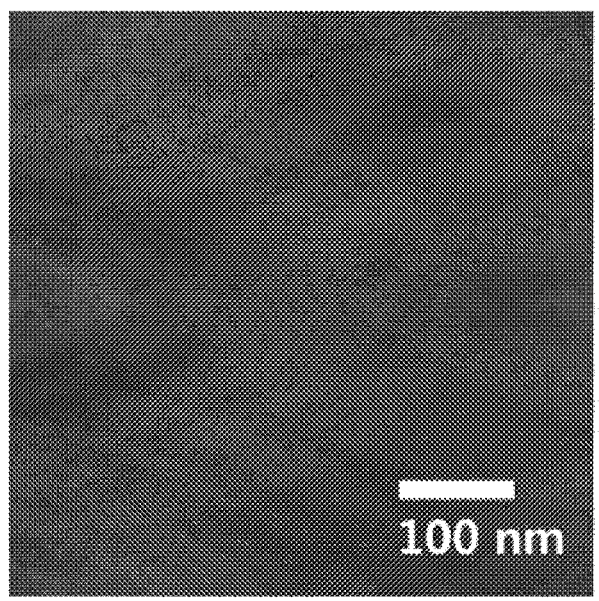

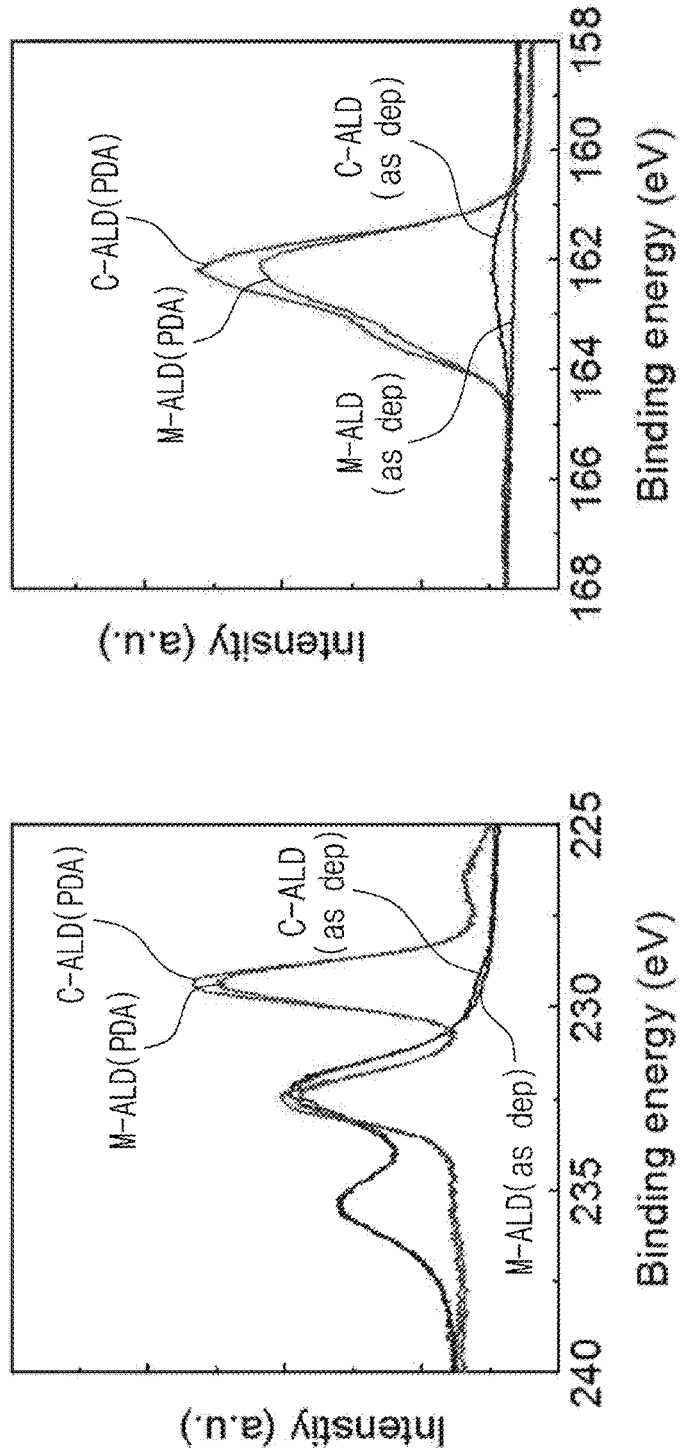
[FIG. 25]

[FIG. 26]
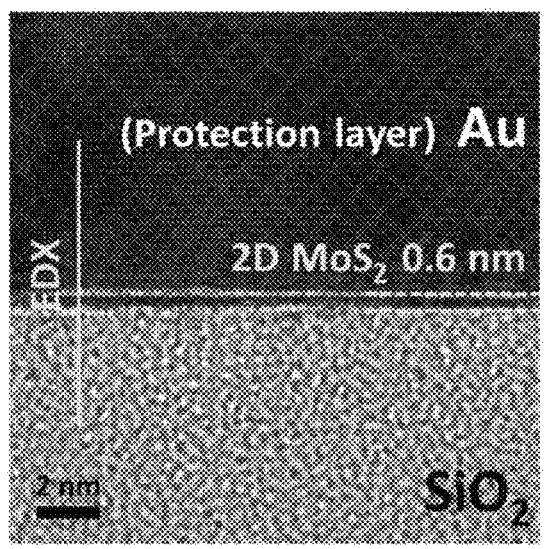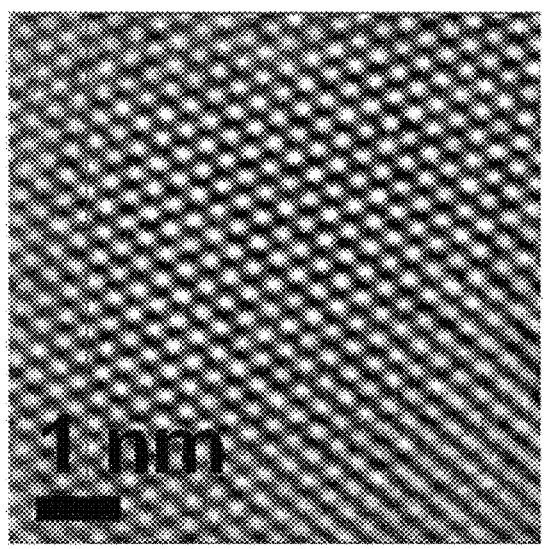

[FIG. 27]
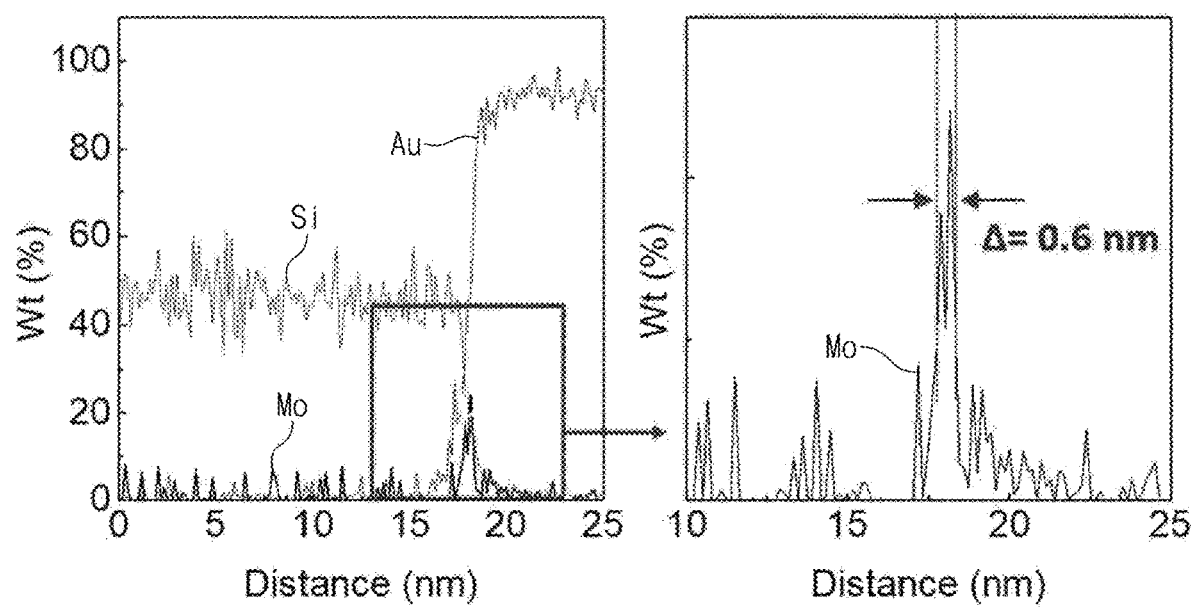

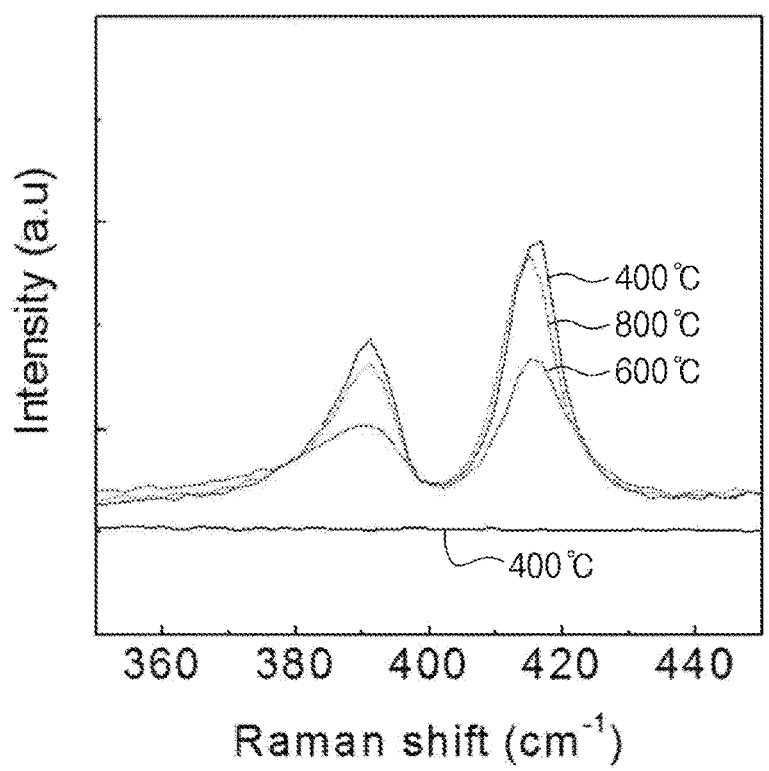
[FIG. 28]

TRANSITION METAL-DICHALCOGENIDE THIN FILM AND MANUFACTURING METHOD THEREFOR

CROSS REFERENCE TO RELATED APPLICATIONS

This application is a continuation of International Application PCT/KR2018/015585 (filed 10 Dec. 2018), which claims the benefit of Republic of Korea Patent Application 10-2017-0170951 (filed 13 Dec. 2017) and Republic of Korea Patent Application 10-2018-0147152 (filed 26 Nov. 2018). All of these priority applications are hereby incorporated herein by reference.

TECHNICAL FIELD

The present application relates to a transition metal-dichalcogenide thin film and a method for manufacturing the same, and more particularly to a method for manufacturing a transition metal-dichalcogenide thin film having an even surface and a uniform thickness, and a method for manufacturing a large-sized two-dimensional transition metal-dichalcogenide thin film by using the same.

BACKGROUND ART

As a structure of a transition metal-chalcogen compound has a layered structure similar to graphene, the transition metal-chalcogen compound has properties of excellent optical transparency and excellent mechanical flexibility, such that the compound may be applied to a next-generation flexible electronic device such as a wearable device, a flexible display, and artificial electronic skin, thus drawing much attention. In particular, a band gap of the transition metal-chalcogen compound is formed into a two-dimensional layered structure similar to graphene, such that transition metal-chalcogen compound is suitable as a semiconductor device. On the other hand, unlike the graphene, the transition metal-chalcogen compound has a band gap of 1-2 ev and thus may be used to implement manufacturing of a logic circuit, which has been difficult with a conventional graphene.

A transition metal-dichalcogenide compound having an $MX_2$ structure may be easily manufactured into a semiconductor thin film. Here, the M represents a transition metal element including Mo or W, and the X indicates a chalcogen element including S, Se and Te. If the transition metal-dichalcogenide compound is formed into a monolayer from the form of bulk, it is possible to adjust a band gap value corresponding to a change in a band structure, and the transition metal-dichalcogenide compound may represent a property of being converted from an indirect band gap semiconductor into a direct band gap semiconductor. Those properties may be ideally applied to various photoelectronic devices such as a photoluminescent diode and a solar cell.

If the transition metal-dichalcogenide compound is manufactured into a monolayered thin film, a transition metal-dichalcogenide thin film has a thickness of three atoms. The monolayered transition metal-dichalcogenide thin film is configured in a sandwich form in which one layer of transition metal element-based atoms is interposed between two layers of chalcogen atoms.

The transition metal-dichalcogenide thin film may be manufactured by a method of peeling off from a multi-layered crystal. However, the transition metal-dichalcogenide thin film manufactured by the above method has disadvantages in that the thin film does not have a uniform thickness and a manufacturing process takes a long time. As an alternative to solve the above problems, it has been common to carry out a method for manufacturing a transition metal-dichalcogenide thin film by using a conventional chemical vapor deposition method.

For example, Korean Unexamined Patent Publication (Publication No.: 10-2017-0014319) discloses a method for manufacturing a two-dimensional transition metal-dichalcogenide thin film by using a chemical vapor deposition method that adjusts a pressure in a deposition chamber to adjust an amount of chalcogen-containing precursor and transition metal-containing precursor, which are supplied into the deposition chamber, thereby adjusting a ratio of partial pressure of the transition metal-containing precursor to the chalcogen-containing precursor.

In case of the conventional chemical vapor deposition method, however, it is difficult to arbitrarily control a phenomenon in which the precursor is adsorbed onto the thin film. Thus, there is a limit to manufacturing the transition metal-dichalcogenide thin film having an even surface and there is a problem in that it is difficult to adjust a thickness of the transition metal-dichalcogenide thin film.

Accordingly, there is a need to develop a technology for manufacturing the transition metal-dichalcogenide thin film having an even surface and a uniform thickness, as well as a technology for manufacturing a large-sized two-dimensional transition metal-dichalcogenide thin film by using the same.

DISCLOSURE

Technical Problem

One technical object of the present application is to provide a method for manufacturing a transition metal-dichalcogenide thin film, in which a temperature of a base substrate is controlled depending on binding force between transition metal and ligand.

Another technical object of the present application is to provide a method for manufacturing a transition metal-dichalcogenide thin film, in which at least a part of a precursor is thermally decomposed and adsorbed onto a base substrate.

Still another technical object of the present application is to provide a method for manufacturing a transition metal-dichalcogenide thin film, in which forming a preliminary thin film and manufacturing a transition metal-dichalcogenide thin film are carried out in chambers independent from each other.

Still another technical object of the present application is to provide a method for manufacturing a transition metal-dichalcogenide thin film, in which a gas atmosphere containing a chalcogen element is provided into the chamber in the forming of the preliminary thin film after the manufacturing of the preliminary thin film.

Still another technical object of the present application is to provide a transition metal-dichalcogenide thin film having an even surface.

Still another technical object of the present application is to provide a transition metal-dichalcogenide thin film having a uniform thickness.

Still another technical object of the present application is to provide a large-sized two-dimensional transition metal-dichalcogenide thin film.

Still another technical object of the present application is to provide a monolayered transition metal-dichalcogenide thin film.

Still another technical object of the present application is to provide a transition metal-dichalcogenide thin film having a higher quantum efficiency and a lower surface roughness value compared to a reference transition metal-dichalcogenide thin layer manufactured by an atomic layer deposition method.

Still another technical object of the present application is to provide a transition metal-dichalcogenide thin film having a higher maximum peak value and a smaller standard deviation of maximum peak values for each region compared to a reference transition metal-dichalcogenide thin layer, when measuring a Raman spectrum.

The technical objects of the present application are not limited to the above.

Technical Solution

To solve the above technical objects, the present application provides a method for manufacturing a transition metal-dichalcogenide thin film.

According to one embodiment, the method for manufacturing a transition metal-dichalcogenide thin film may include preparing a base substrate within a chamber, preparing a precursor including a transition metal, repeatedly carrying out, multiple times, operations of providing the precursor onto the base substrate and purging the chamber, thereby forming, on the base substrate, a preliminary thin film to which the precursor is adsorbed, and manufacturing a transition metal-dichalcogenide thin film by heat-treating the preliminary thin film in a gas atmosphere containing a chalcogen element.

According to one embodiment, the precursor may include the transition metal and a ligand which are coordinately bonded to each other.

According to one embodiment, a temperature of the base substrate may be controlled in the forming of the preliminary thin film depending on binding force between the transition metal and the ligand.

According to one embodiment, a temperature of the base substrate may be increased in the forming of the preliminary thin film as the binding force between the transition metal and the ligand is increased.

According to one embodiment, at least a part of the precursor may be thermally decomposed in the forming of the preliminary thin film and adsorbed onto the base substrate.

According to one embodiment, the preliminary thin film may completely cover an entire surface of the base substrate and the precursor may be stacked on at least a part of the preliminary thin film.

According to one embodiment, the at least a part of the preliminary thin film, on which the precursor is stacked, may include a first portion, and a second portion on the first portion, in which the precursor of the second portion may be thermally decomposed and adsorbed onto the precursor of the first portion.

According to one embodiment, the transition metal-dichalcogenide thin film may be represented by a chemical formula $MX_2$, the M may include at least one from the group consisting of Ti, V, Cr, Mn, Fe, Ni, Zr, Nb, Mo, Tc, Ru, Pd, Hf, Ta, W, Re, and Pt, and the X may include at least one from the group consisting of S, Se, and Te.

According to one embodiment, the forming of the preliminary thin film and the manufacturing of the transition metal-dichalcogenide thin film may be carried out in chambers independent from each other.

According to one embodiment, a gas atmosphere containing a chalcogen element may be provided into the chamber in the forming of the preliminary thin film after the manufacturing of the preliminary thin film.

According to one embodiment, the transition metal-dichalcogenide thin film may be manufactured into a monolayer.

According to one embodiment, the preliminary thin film may completely cover an entire surface of the base substrate.

To solve the above technical objects, the present application provides the transition metal-dichalcogenide thin film.

According to one embodiment, the transition metal-dichalcogenide thin film may include a transition metal-dichalcogenide thin film containing a transition metal and a chalcogen element, in which the transition metal-dichalcogenide thin film may have a higher quantum efficiency and a lower surface roughness value compared to a reference transition metal-dichalcogenide thin layer manufactured by an atomic layer deposition method.

According to one embodiment, the transition metal-dichalcogenide thin film may have a higher maximum peak value and a smaller standard deviation of maximum peak values for each region compared to the reference transition metal-dichalcogenide thin layer, when measuring a Raman spectrum.

According to one embodiment, the transition metal-dichalcogenide thin film may include $MoS_2$.

Advantageous Effects

According to an embodiment of the present application, there may be provided a method for manufacturing a transition metal-dichalcogenide thin film, including preparing a base substrate within a chamber, preparing a precursor including a transition metal, repeatedly carrying out, multiple times, operations of providing the precursor onto the base substrate and purging the chamber, thereby forming, on the base substrate, a preliminary thin film to which the precursor is adsorbed, and manufacturing a transition metal-dichalcogenide thin film by heat-treating the preliminary thin film in a gas atmosphere containing a chalcogen element.

Accordingly, a large-sized two-dimensional transition metal-dichalcogenide thin film may be manufactured into a monolayer. Furthermore, the transition metal-dichalcogenide thin film having an even surface and a uniform thickness may be manufactured.

DESCRIPTION OF DRAWINGS

FIG. 1 is a flowchart for explaining a method for manufacturing a thin film according to an embodiment of the present invention.

FIG. 2 is a view for explaining forming a preliminary thin film according to an embodiment of the present invention.

FIG. 3 is an enlarged view of FIG. 2A.

FIG. 4 is a view for explaining thermal decomposition of a precursor according to an embodiment of the present invention.

FIG. 5 is a view for explaining first and second portions of another preliminary thin film according to an embodiment of the present invention.

FIG. 6 is a view for explaining heat-treating a preliminary thin film according to an embodiment of the present invention in a gas atmosphere containing a chalcogen element.

FIG. 7 is an enlarged view of FIG. 6C.

FIG. 8 is a view for explaining manufacturing a transition metal-dichalcogenide thin film according to an embodiment of the present invention.

FIG. 9 is an enlarged view of FIG. 8D.

FIG. 10 is a view for explaining a method for manufacturing a transition metal-dichalcogenide thin film according to Comparative Example.

FIG. 11 is a graph showing a change in thickness of a transition metal-dichalcogenide thin film, in which the same number of process cycles (30 cycles) is performed according to Comparative Example of the present invention, depending on a temperature of a base substrate.

FIG. 12 is a graph showing a change in thickness of a transition metal-dichalcogenide thin film, in which the same number of process cycles (30 cycles) is performed according to Comparative Example of the present invention, depending on a feeding time of a transition metal precursor.

FIG. 13 is a graph for comparing and explaining a change in thickness (growth rate) of transition metal-dichalcogenide thin films according to Example (M-ALD) of the present invention and Comparative Example (C-ALD), depending on the number of process cycles.

FIG. 14 is a graph showing photoluminescence measured to identify luminescence efficiency of transition metal-dichalcogenide thin films according to Comparative Examples 1 to 5.

FIG. 15 is a graph showing measured photoluminescence of transition metal-dichalcogenide thin films according to Examples 1 to 5 of the present invention.

FIG. 16 is a graph for comparing photoluminescence of transition metal-dichalcogenide thin films according to Examples 1 to 5 (M-ALD) of the present invention and Comparative Examples 1 to 5 (C-ALD).

FIG. 17 is a view showing a mapping for maximum PL peaks to identify luminescence efficiency of transition metal-dichalcogenide thin films according to Comparative Examples 1 to 5.

FIG. 18 is a view showing a mapping for maximum PL peaks to identify luminescence efficiency of transition metal-dichalcogenide thin films according to Examples 1 to 5 of the present invention.

FIG. 19 is a graph for explaining a thickness deviation, which is obtained by measuring a thickness for each point of transition metal-dichalcogenide thin films according to Examples 1 to 5 of the present invention and Comparative Examples 1 to 5.

FIG. 20 is a graph showing a measured Raman shift of transition metal-dichalcogenide thin films according to Examples 1, 3 and 5 of the present invention.

FIG. 21 is a view showing a picture which is obtained by measuring a transition metal-dichalcogenide thin film according to Example 3 of the present invention through an atomic force microscope, as well as a graph showing a measured length-height.

FIG. 22 is a view showing a picture which is obtained by measuring a transition metal-dichalcogenide thin film according to Example 1 of the present invention through an atomic force microscope, as well as a graph showing a measured length-height.

FIG. 23 is a view showing a picture which is obtained by measuring a transition metal-dichalcogenide thin film according to Example 3 of the present invention through an atomic force microscope.

FIG. 24 is a view showing a picture which is obtained by measuring a metal-dichalcogenide thin film according to Example 1 through a scanning electron microscope.

FIG. 25 is a graph showing binding energy measured to identify a chemical configuration of transition metal-dichalcogenide thin films according to Examples (M-ALD) of the present invention and Comparative Examples (C-ALD).

FIG. 26 is a view showing a picture which is obtained by measuring a transition metal-dichalcogenide thin film according to an embodiment of the present invention through a transmission electron microscope.

FIG. 27 is a graph showing an analysis of a transition metal-dichalcogenide thin film according to an embodiment of the present invention through energy-dispersive X-ray spectroscopy (EDS).

FIG. 28 is a graph showing a measured Raman shift of transition metal-dichalcogenide thin films according to Examples 6 to 8 of the present invention and Comparative Example 6.

MODE FOR INVENTION

Hereinafter, preferred embodiments of the present invention will be described in detail with reference to the accompanying drawings. However, the technical spirit of the present invention is not limited to the embodiments, but may be realized in different forms. The embodiments introduced herein are provided to sufficiently deliver the spirit of the present invention to those skilled in the art so that the disclosed contents may become thorough and complete.

When it is mentioned in the specification that one element is on another element, it means that the first element may be directly formed on the second element or a third element may be interposed between the first element and the second element. Further, in the drawings, shape and size are exaggerated for efficient description of the technical contents.

Further, in the various embodiments of the present invention, the terms such as first, second, and third are used to describe various elements, but the elements are not limited to the terms. The terms are used only to distinguish one element from another element. Accordingly, an element mentioned as a first element in one embodiment may be mentioned as a second element in another embodiment. The embodiments illustrated here include their complementary embodiments. Further, the term "and/or" in the specification is used to include at least one of the elements enumerated in the specification.

In the specification, the terms of a singular form may include plural forms unless otherwise specified. Further, the terms "including" and "having" are used to designate that the features, the numbers, the steps, the elements, or combination thereof described in the specification are present, and may be understood that one or more other features, numbers, step, elements, or combinations thereof may be added. In addition, the term "connection" used herein may include the meaning of indirectly connecting a plurality of components, and directly connecting a plurality of components.

Further, in the following description of the present invention, a detailed description of known functions and configurations incorporated herein will be omitted when it may make the subject matter of the present invention unnecessarily unclear.

FIG. 1 is a flowchart for explaining a method for manufacturing a thin film according to an embodiment of the present invention, FIG. 2 is a view for explaining forming a preliminary thin film according to an embodiment of the present invention, and FIG. 3 is an enlarged view of FIG. 2A. FIG. 4 is a view for explaining thermal decomposition of a precursor according to an embodiment of the present invention, FIG. 5 is a view for explaining first and second portions of another preliminary thin film according to an embodiment of the present invention, FIG. 6 is a view for explaining heat-treating a preliminary thin film according to an embodiment of the present invention in a gas atmosphere containing a chalcogen element, and FIG. 7 is an enlarged view of FIG. 6C. FIG. 8 is a view for explaining manufacturing a transition metal-dichalcogenide thin film according to an embodiment of the present invention, FIG. 9 is an enlarged view of FIG. 8D, and FIG. 10 is a view for explaining a method for manufacturing a transition metal-dichalcogenide thin film according to Comparative Example.

Referring to FIGS. 1 and 2, a base substrate 110 may be prepared within a chamber (S110).

According to one embodiment, the chamber may be provided in a vacuum atmosphere.

According to one embodiment, the base substrate 110 may include at least one of an amorphous material or an oxide material. For example, the base substrate 110 may include $SiO_2$ and $Al_2O_3$.

According to another embodiment, the base substrate 110 may include one of a silicon substrate, a compound semiconductor substrate, a plastic substrate or a glass substrate.

A precursor including a transition metal 121 may be prepared (S120).

According to one embodiment, the precursor may include the transition metal 121 and a ligand 122. Specifically, the precursor may include the transition metal 121 and the ligand 122 which are coordinately bonded to each other. As the transition metal 121 and the ligand 122 are coordinately bonded to each other, if the precursor is provided onto the base substrate 110 in an operation to be described below, at least a part of the precursor may be easily thermally decomposed.

Further, according to one embodiment, for thermal decomposition of the precursor, a temperature of the base substrate 110 may be controlled in an operation of forming a preliminary thin film 120 to be described below depending on binding force between the transition metal 121 and the ligand 122.

According to one embodiment, the precursor may include at least one from the group consisting of Ti, V, Cr, Mn, Fe, Ni, Zr, Nb, Mo, Tc, Ru, Pd, Hf, Ta, W, Re, and Pt. For example, the precursor may include at least one from the group consisting of $MoF_6$, $MoCl_6$, and $Mo(CO)_6$.

The precursor may be prepared in a solid state. In other words, the precursor may be provided in the solid state at the room temperature.

Referring to FIG. 3, the preliminary thin film 120, to which the precursor is adsorbed, may be formed on the base substrate 110 by repeatedly carrying out, multiple times, operations of providing the precursor onto the base substrate 110 and purging the chamber (S130).

Referring to FIG. 4, as described in S120, the precursor may include the transition metal 121 and the ligand 122, which are coordinately bonded with each other, through relatively weak binding force. As the transition metal 121 and the ligand 122 are coordinately bonded to each other, if the precursor is provided onto the base substrate 110, the at least a part of the precursor may be easily thermally decomposed.

Further, as described in S120, according to an embodiment of the present invention, a temperature of the base substrate 110 may be controlled depending on binding force between the transition metal 121 and the ligand 122. According to one embodiment, a temperature of the base substrate 110 may be increased in the forming of the preliminary thin film 120 as the binding force between the transition metal 121 and the ligand 122 is increased. Accordingly, the at least a part of the precursor may be easily thermally decomposed.

Referring to FIG. 5, as described above, the at least a part of the precursor is thermally decomposed, and thus the precursor may be stacked on at least a part of the preliminary thin film 120. Specifically, the at least a part of the preliminary thin film 120, on which the precursor is stacked, may include a first portion 123, and a second portion 124 on the first portion 123, in which the precursor of the second portion 124 may be thermally decomposed and adsorbed onto the precursor of the first portion 123 according to an embodiment of the present invention.

On the other hand, unlike an embodiment of the present invention, if the transition metal 121 and the ligand 122 are not coordinately bonded to each other in the precursor or a temperature of the base substrate 110 is not controlled, the precursor may not be thermally decomposed due to binding force between the transition metal 121 and the ligand 122. Accordingly, if the precursor is provided onto the base substrate 110 to form the preliminary thin film 120, the preliminary thin film 120 may not completely cover an entire surface of the base substrate 110. Thus, it may be difficult to manufacture the monolayered transition metal-dichalcogenide thin film 130.

According to an embodiment of the present invention, however, as described above, as the transition metal 121 and the ligand 122 are coordinately bonded to each other, if the precursor is provided onto the base substrate 110, the at least a part of the precursor may be easily thermally decomposed. Further, a temperature of the base substrate 110 may be increased in the forming of the preliminary thin film 120 as the binding force between the transition metal 121 and the ligand 122 is increased. Accordingly, as shown in FIGS. 4 and 5, the precursor may be thermally decomposed. Accordingly, the precursor may be easily adsorbed onto the base substrate 110, and thus the preliminary thin film 120 may be easily formed. In other words, the preliminary thin film 120, which completely covers an entire surface of the base substrate 110, may be provided.

As described above, the preliminary thin film 120 may completely cover the entire surface of the base substrate 110 due to thermal decomposition of the precursor, but may include a more amount of the precursor than an amount of the precursor required to manufacture the transition metal-dichalcogenide thin film 130 to be described below into a monolayer. Accordingly, the transition metal-dichalcogenide thin film 130 may be easily manufactured into a monolayer, and the manufactured transition metal-dichalcogenide thin film 130 may have a better degree of surface uniformity.

In contrast, according to a method for manufacturing a transition metal-dichalcogenide thin film by using a conventional atomic layer deposition method, a transition metal precursor and a chalcogen precursor may be alternately provided onto a base substrate as described above. Accordingly, the transition metal precursor may show a random growth on the base substrate. Thus, if the transition metal-dichalcogenide thin film is manufactured into a monolayer, a degree of uniformity may deteriorate. Further, a self-limit reaction of the transition metal precursor may occur onto the transition metal-dichalcogenide thin film. Accordingly, it may be not easy to form a monolayered transition metal-dichalcogenide thin film having an even surface state.

According to an embodiment of the present invention, as described above, the operations of providing the precursor onto the base substrate 110 and purging the chamber are defined as one unit process, and the unit process may be repeatedly carried out multiple times. Further, as the unit process is repeatedly carried out multiple times, the precursor may be adsorbed onto the base substrate 110 with high density to form the preliminary thin film 120.

On the other hand, unlike an embodiment of the present invention, if the unit process is not repeatedly carried out multiple times, the precursor may not be adsorbed onto the base substrate 110 with high density. Accordingly, in the course of transporting the base substrate 110, in which the preliminary thin film 120 is formed, into a furnace for heat-treatment which is performed after the unit process and in the process of heat-treating the preliminary thin film 120 to be described below, the precursor of the preliminary thin film 120 may be lost to deteriorate a quality of the transition metal-dichalcogenide thin film 130, which is manufactured from the preliminary thin film 120.

As described above, however, according to an embodiment of the present invention, as the unit process is repeatedly carried out multiple times, the precursor may be provided with high density within the preliminary thin film 120. And even if the precursor is lost in the course of transporting the preliminary thin film 120 into a furnace for heat-treatment which is performed after the unit process and in the process of heat-treating the preliminary thin film 120 to be described below, it is possible to minimize a quality deterioration of the transition metal-dichalcogenide thin film 130, which is manufactured from the preliminary thin film 120.

According to one embodiment, as shown in FIG. 5, the precursor may be manufactured into a multilayer within the preliminary thin film 120 as the number of repeating the unit process is increased. Further, as the number of repeating the unit process is increased, a thickness of the preliminary thin film 120 may become thick.

Further, as described above, the precursor may be provided in a solid state at the room temperature. Accordingly, the precursor may be easily adsorbed onto the base substrate 100 so as to manufacture the preliminary thin film 120 to which the precursor is adsorbed with high density.

Referring to FIGS. 6 to 9, a transition metal-dichalcogenide thin film 130 may be manufactured by heat-treating the preliminary thin film 120 in a gas atmosphere containing a chalcogen element 125 (S140).

According to one embodiment, the gas atmosphere may include at least one from the group consisting of S, Se, and Te. For example, the gas atmosphere may include $H_2S$.

According to an embodiment of the present invention, the heat-treating of the preliminary thin film 120 may be performed at a temperature of 600° C. or higher. If a temperature of heat-treatment process is 600° C. or higher, the manufactured transition metal-dichalcogenide thin film 130 may be formed into a structure represented by a chemical formula $MX_2$ (M: element of transition metal 121 and X: chalcogen element 125).

For example, the transition metal-dichalcogenide thin film 130 to be manufactured may include $MoS_2$, when the precursor provided in the unit process is $Mo(CO)_6$, gas containing a chalcogen element 125 provided in the heat-treatment process is $H_2S$, and the temperature of heat-treatment process is 600° C. or higher.

According to an embodiment of the present invention, the preliminary thin film 120 may be cooled down to the room temperature while heat remains after the heat-treatment. For example, the preliminary thin film 120 may be cooled down to the room temperature from a temperature of 150° C. or higher.

If the preliminary thin film 120 is cooled down to the room temperature from a temperature of 150° C. or higher, a loss of the chalcogen element provided onto the preliminary thin film 120 in the heat-treatment process may be minimized.

Unlike an embodiment of the present invention, if the preliminary thin film 120 is not cooled down to the room temperature while heat remains after the heat-treatment, the chalcogen element provided onto the preliminary thin film 120 in the heat-treatment process may be lost to deteriorate a quality of the manufactured transition metal-dichalcogenide thin film 130.

As described above, however, according to an embodiment of the present invention, as the preliminary thin film 120 is cooled down to the room temperature from a temperature of 150° C. or higher, a loss of the chalcogen element 125 provided onto the preliminary thin film 120 may be diminished so that a quality deterioration of the manufactured transition metal-dichalcogenide thin film 130 may be minimized.

According to one embodiment, as described above, the transition metal-dichalcogenide thin film 130 may be manufactured into a monolayer after the heat-treatment process.

For example, if the precursor provided in the unit process is $Mo(CO)_6$ and the gas atmosphere containing $H_2S$ is provided in the heat-treatment process, a $\Delta A_{1g}$-$E^1_{2g}$ distance of the manufactured transition metal-dichalcogenide thin film may be 20 $cm^{-1}$. Here, $A_{1g}$ may represent an out-of-plane vibration and $E^1_{2g}$ may indicate an in-plane vibration. Conventionally, $A_{1g}$ and $E^1_{2g}$ may have sensitive thickness dependence. For example, $A_{1g}$ may be increased as a thickness is increased. $E^1_{2g}$ may be decreased as a thickness is decreased. Thus, it may be possible to identify whether the transition metal-dichalcogenide thin film 130 is a monolayer or a multilayer depending on the $\Delta A_{1g}$-$E^1_{2g}$ distance. If $MoS_2$ is formed into a monolayer, the $\Delta A_{1g}$-$E^1_{2g}$ distance of $MoS_2$ may be 20 $cm^{-1}$. In other words, according to one embodiment, the manufactured transition metal-dichalcogenide thin film 130 may be $MoS_2$ which is manufactured into the monolayer.

According to one embodiment, the forming of the preliminary thin film 120 (S130) and the manufacturing of the transition metal-dichalcogenide thin film 130 (S140) may be carried out in chambers independent from each other. In other words, the forming of the preliminary thin film 120 (S130) and the manufacturing of the transition metal-dichalcogenide thin film 130 (S140) may be carried out in separate facilities.

According to one embodiment, as described above, there may occur a loss of the precursor which is adsorbed onto the base substrate 110, while the base substrate 110, in which preliminary thin film 120 is formed, is transported from the facility, in which the preliminary thin film 120 is formed, into the facility, in which the transition metal-dichalcogenide thin film 130 is manufactured.

As described above, however, according to an embodiment of the present invention, as the unit process is repeatedly carried out multiple times, the precursor may be adsorbed onto the base substrate 110 with high density. Accordingly, even if the precursor of the preliminary thin film 120 is partially lost, it is possible to minimize a quality deterioration of the transition metal-dichalcogenide thin film 130.

On the other hand, unlike an embodiment of the present invention, referring to FIG. 10, in case of following a method for manufacturing a transition metal-dichalcogenide thin film by using an atomic layer deposition method according to Comparative Example, the transition metal-dichalcogenide thin film may show a random growth on the base substrate and thus may be difficult to be manufactured into a monolayer.

In case of a conventional method for manufacturing a transition metal-dichalcogenide thin film, a transition metal precursor and a chalcogen precursor may be alternately provided onto abase substrate, but may not be adsorbed onto the base substrate (screening effect), though a reaction site is present due to a physical contact between the transition metal precursors. Further, formation of the thin film may be hindered (steric hindrance effect) due to a large size of the transition metal precursor.

On the other hand, in case of following a method for manufacturing a transition metal-dichalcogenide thin film 130 according to an embodiment of the present invention, as the gas atmosphere containing the chalcogen element 125 is provided after providing the precursor including the transition metal 121 onto the base substrate 110, the transition metal-dichalcogenide thin film 130 may not show a random growth as shown in FIG. 9 and may be easily manufactured into a monolayer. Specifically, the unit process may be repeatedly carried out multiple times. Accordingly, the precursor may be provided with high density within the preliminary thin film 120 as shown in FIG. 5. In other words, the preliminary thin film 120, to which the transition metal precursor is adsorbed, may substantially cover the entire surface of the base substrate 110. Accordingly, the transition metal-dichalcogenide thin film 130 may be manufactured into a single thin film from the preliminary thin film 120. Further, even if the precursor is lost in the course of transporting the preliminary thin film 120 into a furnace for heat-treatment which is performed after the unit process and in the process of heat-treating the preliminary thin film 120 to be described below, it is possible to minimize a quality deterioration of the transition metal-dichalcogenide thin film 130 which is manufactured from the preliminary thin film 120.

According to an embodiment of the present invention, there may be provided a method for manufacturing a transition metal-dichalcogenide thin film, the method including preparing a base substrate 110 within a chamber, preparing a precursor including a transition metal, repeatedly carrying out, multiple times, operations of providing the precursor on the base substrate 110 and purging the chamber, thereby forming, on the base substrate 110, a preliminary thin film 120 to which the precursor is adsorbed, and manufacturing a transition metal-dichalcogenide thin film 130 by heat-treating the preliminary thin film 120 in a gas atmosphere containing a chalcogen element.

Accordingly, there may be provided a transition metal-dichalcogenide thin film having a higher quantum efficiency and a lower surface roughness value compared to a reference transition metal-dichalcogenide thin layer manufactured by an atomic layer deposition method.

Further, there may be provided a transition metal-dichalcogenide thin film having a higher maximum peak value and a smaller standard deviation of maximum peak values for each region compared to the reference transition metal-dichalcogenide thin layer, when measuring a Raman spectrum.

Unlike the embodiment described above, according to a modified example of the present invention, a gas atmosphere containing a chalcogen element 125 may be provided into the chamber in the forming of the preliminary thin film 120 after manufacturing the preliminary thin film 120.

In other words, after carrying out, multiple times, operations of providing the precursor including the transition metal 121 onto the base substrate 110, which is prepared within a chamber, and purging the chamber, the gas atmosphere containing the chalcogen element 125 may be primarily provided into the same chamber. Accordingly, a preliminary transition metal-dichalcogenide thin film, to which the chalcogen element 125 and the transition metal 121 of the preliminary thin film 120 are bonded, may be manufactured. According to one embodiment, the providing of the gas atmosphere containing the chalcogen element 125 may be carried out at least once.

After that, as described in S140, the gas atmosphere containing the chalcogen element 125 may be secondarily provided to the preliminary transition metal-dichalcogenide thin film, which is prepared in a facility separated from the chamber, to which the gas atmosphere containing the chalcogen element 125 is primarily provided, that is, another chamber. Accordingly, a transition metal-dichalcogenide thin film 130, to which the chalcogen element 125 and the transition metal 121 of the preliminary transition metal-dichalcogenide thin film are bonded, may be manufactured.

According to a modified example of the present invention, a degree of completion of the prepared transition metal-dichalcogenide thin film 130 may be improved depending on the primarily and secondarily providing of the gas atmosphere containing the chalcogen element 125. Hereinafter, specific experimental embodiments will be described with regard to the method for manufacturing the transition metal-dichalcogenide thin film according to an embodiment of the present invention.

Manufacturing of Transition Metal-Dichalcogenide Thin Film According to Example 1

A $SiO_2$ wafer having a thickness of 300 nm was prepared within a chamber. $Mo(CO)_6$ was prepared as a precursor including a transition metal.

A temperature within the chamber, in which a vacuum atmosphere was formed, was set to 175° C., and operations of providing the $Mo(CO)_6$ onto the $SiO_2$ wafer and purging the chamber were carried out repeatedly eight times to form a preliminary thin film in which the $Mo(CO)_6$ was adsorbed onto the $SiO_2$ wafer.

The preliminary thin film was heat-treated at 900° C. for three minutes in a gas atmosphere containing 5% $H_2S$, and cooled down to the room temperature from 150° C., thereby manufacturing a transition metal-dichalcogenide thin film according to Example 1.

Manufacturing of Transition Metal-Dichalcogenide Thin Film According to Example 2

A transition metal-dichalcogenide thin film was manufactured by the same method as shown in Example 1 described above, but operations of providing the $Mo(CO)_6$ onto the $SiO_2$ wafer and purging the chamber were carried out repeatedly nine times to manufacture a transition metal-dichalcogenide thin film according to Example 2.

Manufacturing of Transition Metal-Dichalcogenide Thin Film According to Example 3

A transition metal-dichalcogenide thin film was manufactured by the same method as shown in Example 1 described above, but operations of providing the Mo(CO)$_6$ onto the SiO$_2$ wafer and purging the chamber were carried out repeatedly ten times to manufacture a transition metal-dichalcogenide thin film according to Example 3.

Manufacturing of Transition Metal-Dichalcogenide Thin Film According to Example 4

A transition metal-dichalcogenide thin film was manufactured by the same method as shown in Example 1 described above, but operations of providing the Mo(CO)$_6$ onto the SiO$_2$ wafer and purging the chamber were carried out repeatedly 11 times to manufacture a transition metal-dichalcogenide thin film according to Example 4.

Manufacturing of Transition Metal-Dichalcogenide Thin Film According to Example 5

A transition metal-dichalcogenide thin film was manufactured by the same method as shown in Example 1 described above, but operations of providing the Mo(CO)$_6$ onto the SiO$_2$ wafer and purging the chamber were carried out repeatedly 12 times to manufacture a transition metal-dichalcogenide thin film according to Example 5.

Manufacturing of Transition Metal-Dichalcogenide Thin Film According to Comparative Example 1

A SiO$_2$ wafer having a thickness of 300 nm was prepared within a chamber by the same method as shown in Example 1 described above.

Mo(CO)$_6$ was prepared as a precursor including a transition metal.

Unlike Example 1 described above, H$_2$S was prepared as a precursor including a chalcogen element.

A temperature within the chamber, in which a vacuum atmosphere was formed, was set to 175° C., and operations of providing the Mo(CO)$_6$ onto the SiO$_2$ wafer, purging the chamber, providing the H$_2$S and purging the chamber were carried out repeatedly six times to manufacture a transition metal-dichalcogenide thin film according to Comparative Example 1.

Manufacturing of Transition Metal-Dichalcogenide Thin Film According to Comparative Example 2

A transition metal-dichalcogenide thin film was manufactured by the same method as shown in Comparative Example 1 described above, but operations of providing the Mo(CO)$_6$ onto the SiO$_2$ wafer, purging the chamber, providing the H$_2$S and purging the chamber were carried out repeatedly seven times to manufacture a transition metal-dichalcogenide thin film according to Comparative Example 2.

Manufacturing of Transition Metal-Dichalcogenide Thin Film According to Comparative Example 3

A transition metal-dichalcogenide thin film was manufactured by the same method as shown in Comparative Example 1 described above, but operations of providing the Mo(CO)$_6$ onto the SiO$_2$ wafer, purging the chamber, providing the H$_2$S and purging the chamber were carried out repeatedly eight times to manufacture a transition metal-dichalcogenide thin film according to Comparative Example 3.

Manufacturing of Transition Metal-Dichalcogenide Thin Film According to Comparative Example 4

A transition metal-dichalcogenide thin film was manufactured by the same method as shown in Comparative Example 1 described above, but operations of providing the Mo(CO)$_6$ onto the SiO$_2$ wafer, purging the chamber, providing the H$_2$S and purging the chamber were carried out repeatedly ten times to manufacture a transition metal-dichalcogenide thin film according to Comparative Example 4.

Manufacturing of Transition Metal-Dichalcogenide Thin Film According to Comparative Example 5

A transition metal-dichalcogenide thin film was manufactured by the same method as shown in Comparative Example 1 described above, but operations of providing the Mo(CO)$_6$ onto the SiO$_2$ wafer, purging the chamber, providing the H$_2$S and purging the chamber were carried out repeatedly 12 times to manufacture a transition metal-dichalcogenide thin film according to Comparative Example 5.

The transition metal-dichalcogenide thin films according to Examples 1 to 5 of the present invention and Comparative Examples 1 to 5 may be summarized as shown in the following Table 1.

TABLE 1

| Classification | Number of repeating operations of providing Mo(CO)$_6$ and purging the chamber | Classification | Number of repeating operations of providing Mo(CO)$_6$, purging the chamber, providing H$_2$S and purging the chamber |
|---|---|---|---|
| Example 1 | 8 cycles | Comparative Example 1 | 6 cycles |
| Example 2 | 9 cycles | Comparative Example 2 | 7 cycles |
| Example 3 | 10 cycles | Comparative Example 3 | 8 cycles |
| Example 4 | 11 cycles | Comparative Example 4 | 10 cycles |
| Example 5 | 12 cycles | Comparative Example 5 | 12 cycles |

FIG. 11 is a graph showing a change in thickness of a transition metal-dichalcogenide thin film, in which the same number of process cycles (30 cycles) is performed according to Comparative Example of the present invention, depending on a temperature of a base substrate, FIG. 12 is a graph showing a change in thickness of a transition metal-dichalcogenide thin film, in which the same number of process cycles (30 cycles) is performed according to Comparative Example of the present invention, depending on a feeding time of a transition metal precursor, and FIG. 13 is a graph for comparing and explaining a change in thickness (growth rate) of transition metal-dichalcogenide thin films according to Example (M-ALD) of the present invention and Comparative Example (C-ALD), depending on the number of process cycles.

Referring to FIG. 11, a transition metal-dichalcogenide thin film was deposited by carrying out a process according to Comparative Example of the present invention by 30 cycles, but a temperature of the substrate was gradually increased up to 140° C.-240° C. It can be confirmed that a thickness of the transition metal-dichalcogenide thin film according to Comparative Example is increased as a temperature of the substrate is increased. It can be understood that the thickness of the transition metal-dichalcogenide thin film is rapidly increased after 180° C. and it is difficult to control the thickness of the transition metal-dichalcogenide thin film according to a temperature in a range of temperatures of 180° C. or higher. In other words, it can be understood in case of the transition metal-dichalcogenide thin film according to Comparative Example that a scope of process window is narrow as 160-180.

Further, referring to FIG. 12, the transition metal-dichalcogenide thin film was deposited by carrying out a process according to Comparative Example of the present invention at 175° C. by 30 cycles (Mo precursor feeding—purge (60 seconds)—$H_2S$ feeding (3 seconds)—purge (60 seconds)), but a feeding time of the transition metal precursor was gradually increased. It can be understood that, as the feeding time of the transition metal precursor is increased, a thickness of the transition metal-dichalcogenide thin film according to Comparative Example is increased and thus the thickness of the transition metal-dichalcogenide thin film does not reach saturation.

Referring to FIG. 13, a thickness of the transition metal-dichalcogenide thin film was measured depending on the number of cycles of the process according to Comparative Example (C-ALD) (Mo precursor feeding (35 seconds)—purge (15 seconds)—$H_2S$ feeding (3 seconds)—purge (15 seconds)), and a thickness of the transition metal-dichalcogenide thin film was measured depending on the number of cycles of the process according to Example (M-ALD) of the present invention (heat-treatment after Mo precursor feeding (35 seconds)—purge (15 seconds)*10 cycles). It can be confirmed that a growth rate (GPC) is 0.11 nm/cycle in case of Comparative Example (C-ALD) and a growth rate (GPC) is 0.02 nm/cycle in case of Example (M-ALD) of the present invention. Specifically, it can be confirmed that a thickness of the transition metal-dichalcogenide thin film according to Example (M-ALD) of the present invention is 5.5 times thinner depending on the number of cycles than a thickness of the transition metal-dichalcogenide thin film according Comparative Example (C-ALD). Accordingly, in case of using a method for manufacturing a transition metal-dichalcogenide thin film according to the embodiment of the present invention, a feeding amount of the precursor may be precisely adjusted to manufacture the transition metal-dichalcogenide thin film with an improve degree of uniformity.

FIG. 14 is a graph showing measured photoluminescence of transition metal-dichalcogenide thin films according to Comparative Examples 1 to 5, FIG. 15 is a graph showing measured photoluminescence of transition metal-dichalcogenide thin films according to Examples 1 to 5 of the present invention, and FIG. 16 is a graph for comparing photoluminescence of transition metal-dichalcogenide thin films according to Examples 1 to 5 (M-ALD) of the present invention and Comparative Examples 1 to 5 (C-ALD).

Referring to FIGS. 14 and 15, in case of using a method for manufacturing transition metal-dichalcogenide thin films according to Examples 1 to 5 of the present invention and Comparative Examples 1 to 5, it can be understood that the transition metal-dichalcogenide thin film may be manufactured into a monolayer. However, it can be confirmed that the transition metal-dichalcogenide thin films according to Examples 1 to 5 of the present invention have a more excellent quantum efficiency than the transition metal-dichalcogenide thin films according to Comparative Examples 1 to 5.

Referring to FIG. 16, PL peak was normalized by being divided by $MoS_2$ Raman peak intensity to compare luminescence efficiency. A ratio of PL intensity to Raman peak of the transition metal-dichalcogenide ($MoS_2$) thin film may be proportional to quantum efficiency of the monolayered transition metal-dichalcogenide thin film. As a defect of the monolayered transition metal-dichalcogenide thin film (that is, bilayer) is increased, a location of PL peak may be shifted to the right and intensity may be also decreased. If the transition metal-dichalcogenide thin film is a monolayer, a maximum intensity peak may be observed. Accordingly, it can be understood that the transition metal-dichalcogenide thin film according to Examples 1 to 5 of the present invention is manufactured into a monolayer.

Further, in case of the transition metal-dichalcogenide thin films according to Comparative Examples 1 to 5, the peak and intensity observed in the transition metal-dichalcogenide thin film may vary depending on a measured location. In contrast, in case of the transition metal-dichalcogenide thin films according to Examples 1 to 5 of the present invention, the peak and intensity observed in the transition metal-dichalcogenide thin film may be uniform in all the regions. From the experimental results, it can be understood that luminescence efficiency of transition metal-dichalcogenide thin films according to Comparative Examples is 1.25 times higher, but luminescence efficiency of transition metal-dichalcogenide thin films according to Examples of the present invention is 11.5 times higher, thus showing relatively superior performance.

FIG. 17 is a view showing a mapping for maximum PL peaks to identify luminescence efficiency of transition metal-dichalcogenide thin films according to Comparative Examples 1 to 5, FIG. 18 is a view showing a mapping for maximum. PL peaks to identify luminescence efficiency of transition metal-dichalcogenide thin films according to Examples 1 to 5 of the present invention, FIG. 19 is a graph for explaining a thickness deviation, which is obtained by measuring a thickness for each point of transition metal-dichalcogenide thin films according to Examples 1 to 5 of the present invention and Comparative Examples 1 to 5, and FIG. 20 is a graph showing a measured Raman shift of transition metal-dichalcogenide thin films according to Examples 1, 3 and 5 of the present invention.

Referring to FIGS. 17 and 18, it can be confirmed that monolayered $MoS_2$ is deposited onto a 4-inch $SiO_2$ wafer by a method for manufacturing a transition metal-dichalcogenide thin film according to Comparative Examples (C-ALD) and by a method for manufacturing a transition metal-dichalcogenide thin film according to Examples (M-ALD) of the present invention.

In case of the transition metal-dichalcogenide thin film manufactured by a method for manufacturing a transition metal-dichalcogenide thin film according to Comparative Example, it can be observed that location and intensity of max. PL peak vary depending on locations (standard deviation 1.2). In contrast, incase of the transition metal-dichalcogenide thin film manufactured by a method for manufacturing a transition metal-dichalcogenide thin film according to Example of the present invention, it can be observed that max. PL peak is relatively constant (standard deviation 0.5).

From inserted graphs of FIGS. 17 and 18, it is possible to confirm Raman shift data of transition metal-dichalcogenide thin films according to Examples of the present invention and Comparative Examples. Considering that Raman shift of the transition metal-dichalcogenide thin film is about 20.1 $cm^{-1}$, it can be understood that the transition metal-dichalcogenide thin film is manufactured into a monolayer.

Meanwhile, referring to FIG. 19, as a result of measuring uniformity of the transition metal-dichalcogenide thin film having a size of 5 cm, it can be understood that the transition metal-dichalcogenide thin films according to Examples of the present invention have more excellent uniformity than that of the transition metal-dichalcogenide thin films according to Comparative Examples.

Referring to FIG. 20, it can be observed that the transition metal-dichalcogenide thin film according to Example 5 of the present invention represents an interval of more than 20.1 $cm^{-1}$ between two peaks. Accordingly, it can be understood that the transition metal-dichalcogenide thin film partially includes a bilayer. Meanwhile, it can be observed that the transition metal-dichalcogenide thin film according to Example 3 of the present invention represents an interval equal to 20.1 $cm^{-1}$ between two peaks. Accordingly, it can be understood that the transition metal-dichalcogenide thin film is manufactured into a monolayer. From the experimental results, if the number of repeating operations of providing $Mo(CO)_6$ and purging the chamber is performed by 10 cycles, it can be understood that the transition metal-dichalcogenide thin film is easily manufactured into a monolayer.

FIG. 21 is a view showing a picture which is obtained by measuring a transition metal-dichalcogenide thin film according to Example 3 of the present invention through an atomic force microscope, as well as a graph showing a measured length-height, and FIG. 22 is a view showing a picture which is obtained by measuring a transition metal-dichalcogenide thin film according to Example 1 of the present invention through an atomic force microscope, as well as a graph showing a measured length-height.

Referring to FIGS. 21 and 22, it may be confirmed that the transition metal-dichalcogenide thin films according to Examples 1 and 3 of the present invention are monolayers having an average thickness of 0.6 nm within a range of an average length of 12 μm.

Meanwhile, it can be confirmed that the transition metal-dichalcogenide thin film according to Example 3 of the present invention has a thickness deviation of +0.5 to −0.1, but the transition metal-dichalcogenide thin film according to Example 1 has a thickness deviation of +1.5 to −1. In other words, if the number of repeating operations of providing $Mo(CO)_6$ and purging the chamber is performed by 10 cycles, it means that an even thickness distribution appears within a range of an average length of 12 μm.

FIG. 23 is a view showing a picture which is obtained by measuring an upper surface of a transition metal-dichalcogenide thin film according to Example 3 of the present invention through a scanning electron microscope, and FIG. 24 is a view showing a picture which is obtained by measuring an upper surface of a metal-dichalcogenide thin film according to Example 1 through a scanning electron microscope.

Referring to FIGS. 23 and 24, it can be confirmed that the transition metal-dichalcogenide thin film according to Example 3 of the present invention shows an even surface within a range of 500×500 nm area compared to the transition metal-dichalcogenide thin film according to Example 1.

FIG. 25 is a graph showing binding energy measured to identify a chemical configuration of transition metal-dichalcogenide thin films according to Examples (M-ALD) of the present invention and Comparative Examples (C-ALD), FIG. 26 is a view showing a picture which is obtained by photographing an upper surface and a lateral surface of a transition metal-dichalcogenide thin film according to an embodiment of the present invention through a transmission electron microscope, and FIG. 27 is a graph showing an analysis of a transition metal-dichalcogenide thin film according to an embodiment of the present invention through energy-dispersive X-ray spectroscopy (EDS).

Referring to FIG. 25, it can be confirmed that transition metal-dichalcogenide thin films according to Examples of the present invention and Comparative Examples include $MoS_2$ as a chemical configuration. Further, referring to FIGS. 26 and 27, it can be confirmed that $MoS_2$ having a thickness of 0.6 nm is uniformly deposited in a monolayer. From the above results, in accordance with a method for manufacturing a transition metal-dichalcogenide thin film according to an embodiment of the present invention, it can be understood that the transition metal-dichalcogenide thin film having a thickness of 0.6 nm, which includes $MoS_2$ as a chemical configuration, may be easily manufactured into a monolayer.

Hereinafter, specific experimental embodiments will be described with regard to the method for manufacturing the transition metal-dichalcogenide thin film according to a modified example of the present invention.

Manufacturing of Transition Metal-Dichalcogenide Thin Film According to Example 6

A transition metal-dichalcogenide thin film was manufactured by the same method as shown in Example 1 described above, but operations of providing the $Mo(CO)_6$ onto the $SiO_2$ wafer and purging the chamber were carried out repeatedly 20 times to manufacture a transition metal-dichalcogenide thin film according to Example 6.

Manufacturing of Transition Metal-Dichalcogenide Thin Film According to Example 7

The transition metal-dichalcogenide thin film was manufactured by the same method as shown in Example 6 described above, but the preliminary thin film was heat-treated at 800° C. for three minutes in a gas atmosphere containing 5% $H_2S$, and cooled down to the room temperature from 150° C., thereby manufacturing a transition metal-dichalcogenide thin film according to Example 7.

Manufacturing of Transition Metal-Dichalcogenide Thin Film According to Example 8

The transition metal-dichalcogenide thin film was manufactured by the same method as shown in Example 6 described above, but the preliminary thin film was heat-treated at 600° C. for three minutes in a gas atmosphere containing 5% $H_2S$, and cooled down to the room temperature from 150° C., thereby manufacturing a transition metal-dichalcogenide thin film according to Example 8.

Manufacturing of Transition Metal-Dichalcogenide Thin Film According to Comparative Example 6

The transition metal-dichalcogenide thin film was manufactured by the same method as shown in Example 6 described above, but the preliminary thin film was heat-treated at 400° C. for three minutes in a gas atmosphere containing 5% $H_2S$, and cooled down to the room temperature from 150° C., thereby manufacturing a transition metal-dichalcogenide thin film according to Comparative Example 1.

The transition metal-dichalcogenide thin films according to Examples 7 and 8 and Comparative Example 6 may be summarized as shown in the following Table 2.

TABLE 2

| Classification | Heat-treatment temperature of preliminary thin film |
|---|---|
| Example 7 | 800° C. |
| Example 8 | 600° C. |
| Comparative Example 16 | 400° C. |

FIG. 28 is a graph showing a measured Raman shift of transition metal-dichalcogenide thin films according to Examples 6 to 8 of the present invention and Comparative Example 6.

Referring to FIG. 28, it can be confirmed that a peak of $MoS_2$ wavelength is not observed from the transition metal-dichalcogenide thin film heat-treated at 400° C. according to Comparative Example 6 and a peak of $MoS_2$ wavelength is observed from the transition metal-dichalcogenide thin film heat-treated at 600° C. or higher according to Examples 6 to 8 of the present invention. In other words, it means that the transition metal-dichalcogenide thin films according to Examples 6 to 8 of the present invention include $MoS_2$.

Although the invention has been described in detail with reference to exemplary embodiments, the scope of the present invention is not limited to a specific embodiment and should be interpreted by the attached claims. In addition, those skilled in the art should understand that many modifications and variations are possible without departing from the scope of the present invention.

INDUSTRIAL APPLICABILITY

A transition metal-dichalcogenide thin film according to an embodiment of the present invention may be utilized in various technical fields such as semiconductor devices, display devices, etc.

The invention claimed is:

1. A method for manufacturing a transition metal-dichalcogenide thin film, the method comprising:
    preparing a base substrate within a chamber;
    preparing a precursor including a transition metal and a ligand which are coordinately bonded to each other;
    performing multiple deposition cycles of providing the precursor onto the base substrate and purging the chamber, thereby forming a preliminary thin film, to which the precursor is adsorbed, on the base substrate, wherein a first temperature of the base substrate is controlled while forming the preliminary thin film depending on a binding force between the transition metal and the ligand; and
    upon completion of one of the deposition cycles, manufacturing a transition metal-dichalcogenide thin film by heat-treating the preliminary thin film in a gas atmosphere containing a chalcogen element at a second temperature that is higher than the first temperature,
    wherein at least a part of the precursor is thermally decomposed by the first temperature of the base substrate.

2. The method of claim 1, wherein the first temperature of the base substrate is increased while forming the preliminary thin film as the binding force between the transition metal and the ligand is increased.

3. The method of claim 1, wherein the preliminary thin film completely covers an entire surface of the base substrate, and the precursor is stacked on at least a part of the preliminary thin film.

4. The method of claim 3, wherein the at least a part of the preliminary thin film, on which the precursor is stacked, includes a first portion, and a second portion on the first portion, and wherein the precursor of the second portion is thermally decomposed and adsorbed onto the precursor of the first portion.

5. The method of claim 1, wherein the transition metal-dichalcogenide thin film is represented by a chemical formula $MX_2$, the M includes at least one from the group consisting of Ti, V, Cr, Mn, Fe, Ni, Zr, Nb, Mo, Tc, Ru, Pd, Hf, Ta, W, Re, and Pt, and the X includes at least one from the group consisting of S, Se, and Te.

6. The method of claim 1, wherein the forming of the preliminary thin film and the manufacturing of the transition metal-dichalcogenide thin film are carried out in chambers independent from each other.

7. The method of claim 1, wherein the gas atmosphere containing the chalcogen element is provided into the chamber after the manufacturing of the preliminary thin film.

8. The method of claim 1, wherein the transition metal-dichalcogenide thin film is manufactured into a monolayer.

9. The method of claim 1 wherein the precursor includes $Mo(CO)_6$.

10. The method of claim 1, wherein the gas atmosphere containing the chalcogen element includes $H_2S$.

11. The method of claim 1, wherein the transition metal-dichalcogenide thin film includes $MoS_2$.

12. The method of claim 1, wherein:
    the first temperature is in a range of 140° C. to 240° C.; and
    the second temperature is above 600° C.

* * * * *